United States Patent
Ikebe et al.

(10) Patent No.: US 11,815,807 B2
(45) Date of Patent: Nov. 14, 2023

(54) REFLECTIVE MASK BLANK, REFLECTIVE MASK, METHOD OF MANUFACTURING REFLECTIVE MASK, AND METHOD OF MANUFACTURING SEMICONDUCTOR DEVICE

(71) Applicant: HOYA CORPORATION, Tokyo (JP)

(72) Inventors: Yohei Ikebe, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/990,163

(22) Filed: Nov. 18, 2022

(65) Prior Publication Data

US 2023/0087016 A1    Mar. 23, 2023

Related U.S. Application Data

(63) Continuation of application No. 17/056,676, filed as application No. PCT/JP2019/020635 on May 24, 2019, now Pat. No. 11,550,215.

(30) Foreign Application Priority Data

May 25, 2018  (JP) .................................. 2018-100363
Sep. 4, 2018  (JP) .................................. 2018-165248

(51) Int. Cl.
*G03F 1/32* (2012.01)
*G03F 1/24* (2012.01)

(52) U.S. Cl.
CPC . *G03F 1/32* (2013.01); *G03F 1/24* (2013.01)

(58) Field of Classification Search
CPC ..................................... G03F 1/24; G03F 1/32
USPC ............................................................ 430/5
See application file for complete search history.

(56) References Cited

U.S. PATENT DOCUMENTS

| | | | |
|---|---|---|---|
| 10,394,113 B2 | 8/2019 | Hamamoto et al. | |
| 2010/0028787 A1 | 2/2010 | Koike et al. | |
| 2011/0171568 A1 | 7/2011 | Sasaki et al. | |
| 2013/0209925 A1 | 8/2013 | Sasaki et al. | |
| 2016/0004153 A1 | 1/2016 | Shoki et al. | |
| 2016/0238924 A1 | 8/2016 | Burkhardt et al. | |
| 2017/0038673 A1 | 2/2017 | Ikebe et al. | |
| 2018/0329285 A1 | 11/2018 | Hamamoto et al. | |
| 2019/0079383 A1 | 3/2019 | Ikebe | |
| 2020/0249558 A1 | 8/2020 | Hamamoto et al. | |

FOREIGN PATENT DOCUMENTS

| | | |
|---|---|---|
| JP | 2004207593 A | 7/2004 |
| JP | 2009206287 A | 9/2009 |
| JP | 2010080659 A | 4/2010 |
| JP | 2012151368 A | 8/2012 |
| JP | 2012256066 A | 12/2012 |
| JP | 2014033221 A | 2/2014 |
| JP | 2015122468 A | 7/2015 |
| JP | 2015142083 A | 8/2015 |
| JP | 2016122684 A | 7/2016 |
| TW | 201909239 A | 3/2019 |
| TW | 201928503 A | 7/2019 |
| WO | 2015098400 A1 | 7/2015 |
| WO | 2016104239 A1 | 6/2016 |
| WO | 2017169658 A1 | 10/2017 |

OTHER PUBLICATIONS

U.S. Appl. No. 17/056,676, "Non-Final Office Action", dated Jun. 7, 2022, 8 pages.
U.S. Appl. No. 17/056,676, "Notice of Allowance", dated Aug. 31, 2022, 5 pages.
PCT/JP2019/020635, "English translation of International Search Report", dated Aug. 13, 2019, 2 pages.
SG11202011373S, "Invitation to Respond to Written Opinion", dated May 2, 2022, 7 pages.
U.S. Appl. No. 17/056,676, "Corrected Notice of Allowability", dated Dec. 12, 2022, 2 pages.
TW108118020, "Invitation to Respond to Written Opinion", dated Nov. 25, 2022, 7 pages.
JP2020-520392, "Notice of Reasons for Refusal" with Machine Translation, dated Jun. 6, 2023, 5 pages.

*Primary Examiner* — Christopher G Young
(74) *Attorney, Agent, or Firm* — Kilpatrick Townsend & Stockton LLP

(57) ABSTRACT

Provided is a reflective mask blank with which it is possible to further reduce the shadowing effect of a reflective mask, and also possible to form a fine and highly accurate phase-shift pattern. A reflective mask blank having, in the following order on a substrate, a multilayer reflective film and a phase-shift film that shifts the phase of EUV light, said reflective mask blank characterized in that: the phase-shift film has a first layer and a second layer; the first layer comprises a material that contains at least one element from among tantalum (Ta) and chromium (Cr); and the second layer comprises a metal-containing material that contains ruthenium (Ru) and at least one element from among chromium (Cr), nickel (Ni), cobalt (Co), vanadium (V), niobium (Nb), molybdenum (Mo), tungsten (W), and rhenium (Re).

19 Claims, 3 Drawing Sheets

REFLECTIVE MASK BLANK, REFLECTIVE MASK, METHOD OF MANUFACTURING REFLECTIVE MASK, AND METHOD OF MANUFACTURING SEMICONDUCTOR DEVICE

CROSS-REFERENCE TO RELATED APPLICATIONS

This application is a continuation of U.S. application Ser. No. 17/056,676, filed Nov. 18, 2020, which is a National Stage of International Application No. PCT/JP2019/020635, filed May 24, 2019, which claims priority to Japanese Patent Application No. 2018-100363, filed May 25, 2018, and claims priority to Japanese Patent Application No. 2018-165248, filed Sep. 4, 2018, and the contents of which are incorporated by reference.

TECHNICAL FIELD

The present disclosure relates to a reflective mask blank that is an original plate for manufacturing an exposure mask used for manufacturing a semiconductor device, a reflective mask, a method of manufacturing the reflective mask, and a method of manufacturing a semiconductor device.

BACKGROUND ART

Types of light sources of exposure apparatuses in manufacturing semiconductor devices have been evolving while wavelengths thereof have been shortened gradually like a g-line having a wavelength of 436 nm, an i-line having a wavelength of 365 nm, a KrF laser having a wavelength of 248 nm, and an ArF laser having a wavelength of 193 nm. In order to achieve further finer pattern transfer, extreme ultra violet (EUV) lithography using EUV having a wavelength in the neighborhood of 13.5 nm has been developed. In the EUV lithography, a reflective mask is used because there are few materials transparent to EUV light. This reflective mask has a basic structure in which a multilayer reflective film that reflects exposure light is formed on a low thermal expansion substrate and a desired pattern for transfer is formed on a protective film for protecting the multilayer reflective film. In addition, typical examples of the structure of the pattern for transfer include a binary type reflection mask and a phase shift type reflection mask (a half-tone phase shift type reflection mask). The binary type reflection mask has a relatively thick absorber pattern that sufficiently absorbs EUV light. The phase shift type reflection mask has a relatively thin absorption pattern (a phase shift pattern) that reduces EUV light by light absorption and generates reflected light having a phase substantially inverted (a phase inverted by approximately 180 degrees) with respect to reflected light from the multilayer reflective film. This phase shift type reflection mask has a resolution improving effect because high transfer optical image contrast can be obtained by a phase shift effect, as with a transmission type optical phase shift mask. In addition, since the film thickness of the absorber pattern (the phase shift pattern) of the phase shift type reflection mask is thin, a fine and highly accurate phase shift pattern can be formed.

In the EUV lithography, projection optical systems including a large number of reflecting mirrors are used due to light transmittance. Then, EUV light is made obliquely incident on the reflective mask to cause these reflecting mirrors not to block projection light (exposure light). At present, an incident angle is typically 6 degrees with respect to a vertical plane of a reflection mask substrate. Along with the improvement of a numerical aperture (NA) of the projection optical system, studies are being conducted toward making the incident angle about 8 degrees that is a more oblique incident angle.

In the EUV lithography, since the exposure light is obliquely incident, there is a specific problem called a shadowing effect. The shadowing effect is a phenomenon in which exposure light is obliquely incident on an absorber pattern having a three-dimensional structure, whereby a shadow is formed and a dimension and position of a transferred and formed pattern change. The three-dimensional structure of the absorber pattern serves as a wall to form a shadow on a shade side, and the dimension and position of the transferred and formed pattern change. For example, a difference occurs in a dimension and position of a transfer pattern between both cases, a case where the orientation of the absorber pattern to be arranged is parallel to a direction of obliquely incident light and a case where the orientation of the absorber pattern to be arranged is perpendicular to the direction of the obliquely incident light, thereby decreasing transfer accuracy.

Patent Literatures 1 to 3 disclose techniques related to such a reflective mask for EUV lithography and a mask blank for manufacturing the same. In addition, Patent Literature 1 also discloses a shadowing effect. By using a phase shift type reflection mask as a reflective mask for EUV lithography, the film thickness of a phase shift pattern is made relatively thinner than the film thickness of the absorber pattern of the binary type reflection mask, whereby a decrease in the transfer accuracy due to the shadowing effect is reduced.

CITATION LIST

Patent Literature

Patent Literature 1: JP 2010-080659 A
Patent Literature 2: JP 2004-207593 A
Patent Literature 3: JP 2009-206287 A

DISCLOSURE OF THE INVENTION

The finer the pattern is and the more the accuracy of the pattern dimension and pattern position is improved, the more the electrical characteristics and performance of the semiconductor device increase, and the degree of integration can be improved and a chip size can be reduced. Thus, the EUV lithography is required to have performance of transferring dimension patterns that are more accurate and finer than conventional ones. Formation of an ultra-fine and highly accurate pattern for half pitch 16 nm (hp 16 nm) generation is presently required. A further reduction in the film thickness of an absorber film (a phase shift film) is required in order to reduce the shadowing effect in response to such a requirement. In particular, in the case of EUV exposure, the film thickness of the absorber film (the phase shift film) is required to be less than 60 nm and preferably 50 nm or less.

As disclosed in Patent Literatures 1 to 3, Ta has been conventionally used as a material for forming the absorber film (the phase shift film) of a reflective mask blank. However, a refractive index n of Ta in EUV light (for example, with a wavelength of 13.5 nm) is approximately 0.943. Thus, even if the phase shift effect of Ta is used, the lower limit of the film thickness of the absorber film (the phase shift film) formed of Ta alone is 60 nm that is the lowest. For example, a metal material having a small refractive index n (having a large phase shift effect) can be used in order to further reduce the film thickness. As a metal material having a small refractive index n at a wavelength of 13.5 nm, there are Mo (n=0.921) and Ru (n=0.887) as described, for example, in FIG. 7 of Patent Literature 1. However, Mo is easy to oxidize and there is a concern about cleaning resistance, and Ru has a low etching rate and is difficult to process and repair.

In view of the points described above, it is an aspect of the present disclosure to provide a reflective mask blank capable of reducing further a shadowing effect of a reflective mask and forming a fine and highly accurate phase shift pattern and a reflective mask manufactured using the reflective mask blank and to provide a method of manufacturing a semiconductor device.

In order to solve the above problems, the present disclosure has the following configurations.

(Configuration 1)

A configuration 1 of the present disclosure is a reflective mask blank comprising a multilayer reflective film and a phase shift film for shifting a phase of EUV light on a substrate in this order, the phase shift film comprises a first layer and a second layer, the first layer comprises a material containing at least one or more elements of tantalum (Ta) and chromium (Cr), and the second layer comprises a material comprising a metal containing ruthenium (Ru) and at least one or more elements of chromium (Cr), nickel (Ni), cobalt (Co), vanadium (V), niobium (Nb), molybdenum (Mo), tungsten (W), and rhenium (Re).

According to the configuration 1 of the present disclosure, it is possible to obtain a phase shift film having thin film thickness necessary for reflected light from a phase shift pattern to have a predetermined phase difference as compared with reflected light from an opening of a reflective mask pattern. Thus, a shadowing effect caused by the phase shift pattern can be further reduced in a reflective mask. In addition, according to the configuration 1 of the present disclosure, it is possible to obtain a phase shift film having high relative reflectance (relative reflectance when EUV light reflected at a part where the phase shift pattern is not present is assumed to be 100% reflectance). In addition, a reflective mask manufactured from a reflective mask blank having the configuration 1 of the present disclosure is used, whereby it is possible to improve throughput when a semiconductor device is manufactured.

(Configuration 2)

A configuration 2 of the present disclosure is the reflective mask blank according to the configuration 1, in which the second layer comprises a material comprising a metal containing ruthenium (Ru) and at least one or more elements of chromium (Cr), nickel (Ni), and cobalt (Co).

According to the configuration 2 of the present disclosure, an etching rate by a dry etching gas at the time of patterning the phase shift film can be increased, so that the film thickness of a resist film can be reduced. This is advantageous in forming a fine pattern of the phase shift film.

(Configuration 3)

A configuration 3 of the present disclosure is the reflective mask blank according to the configuration 1 or 2, in which a protective film is further included between the multilayer reflective film and the phase shift film, the protective film is made of a material containing ruthenium (Ru), and the first layer and the second layer are layered in this order on the protective film.

According to the configuration 3 of the present disclosure, the first layer containing tantalum (Ta) and/or chromium (Cr) is arranged between the protective film containing ruthenium (Ru) and the second layer, whereby when the first layer of the phase shift film is etched, it is possible to use an etching gas to which the protective film containing ruthenium (Ru) has resistance.

(Configuration 4)

A configuration 4 of the present disclosure is the reflective mask blank of configuration 1 or 2, in which a protective film is further included between the multilayer reflective film and the phase shift film, the protective film is made of a material containing silicon (Si) and oxygen (O), and the second layer and the first layer are layered in this order on the protective film.

According to the configuration 4 of the present disclosure, the second layer containing ruthenium (Ru) is arranged on the protective film containing silicon (Si) and oxygen (O), whereby it is possible to use an etching gas to which the protective film has resistance to etch the second layer of the phase shift film.

(Configuration 5)

A configuration 5 of the present disclosure is a reflective mask comprising a phase shift pattern obtained by patterning the phase shift film in the reflective mask blank according to any one of the configurations 1 to 4.

According to the configuration 5 of the present disclosure, since the phase shift pattern of the reflective mask can absorb EUV light and reflect part of EUV light with a predetermined phase difference with respect to an opening (a part where the phase shift pattern is not formed), the reflective mask (an EUV mask) of the present disclosure can be manufactured by patterning the phase shift film of the reflective mask blank.

(Configuration 6)

A configuration 6 of the present disclosure is a method of manufacturing a reflective mask, in which the first layer in the reflective mask blank according to any one of the configurations 1 to 4 comprises a material containing tantalum (Ta), and a phase shift pattern is formed by patterning the second layer by a dry etching gas comprising a chlorine-based gas and an oxygen gas and then by patterning the first layer by a dry etching gas comprising a halogen-based gas comprising no oxygen gas.

The first layer containing tantalum (Ta) can be etched by the dry etching gas including a halogen-based gas including no oxygen gas. Meanwhile, the second layer containing ruthenium (Ru) has resistance to the dry etching gas including a halogen-based gas including no oxygen gas. According to the configuration 6 of the present disclosure, the first layer and the second layer are etched by different dry etching gases, whereby the phase shift film including the first layer and the second layer can be patterned finely and highly accurately.

(Configuration 7)

A configuration 7 of the present disclosure is a method of manufacturing a reflective mask, in which the first layer in the reflective mask blank according to any one of the configurations 1 to 4 comprises a material containing chromium (Cr), and a phase shift pattern is formed by patterning the second layer by a dry etching gas comprising an oxygen gas and then by patterning the first layer by a dry etching gas comprising a chlorine-based gas comprising no oxygen gas.

The first layer containing chromium (Cr) can be etched by the dry etching gas including a chlorine-based gas including no oxygen gas. Meanwhile, the second layer containing ruthenium (Ru) has resistance to the dry etching gas including a chlorine-based gas including no oxygen gas. According to the configuration 7 of the present disclosure, the first layer and the second layer are etched by different dry etching gases, whereby the phase shift film including the first layer and the second layer can be patterned finely and highly accurately.

(Configuration 8)

A configuration 8 of the present disclosure is a method of manufacturing a reflective mask, in which the first layer in the reflective mask blank according to any one of the configurations 1 to 4 comprises a material containing chromium (Cr), and a phase shift pattern is formed by patterning the second layer and the first layer by a dry etching gas comprising a chlorine-based gas and an oxygen gas.

According to the configuration 8 of the present disclosure, the first layer containing chromium (Cr) and the second layer containing ruthenium (Ru) are etched by a predetermined one kind of a dry etching gas, whereby a phase shift film including the first layer and the second layer can be patterned by a single etching process.

(Configuration 9)

A configuration 9 of the present disclosure is a method of manufacturing a semiconductor device, in which the method includes the reflective mask of the configuration 5 in an exposure apparatus comprising an exposure light source that emits EUV light, and transferring a transfer pattern to a resist film formed on a transferred substrate.

According to the method of manufacturing a semiconductor device according to the configuration 9 of the present disclosure, a reflective mask capable of reducing the film thickness of the phase shift film, reducing the shadowing effect, and forming a fine and highly accurate phase shift pattern in a stable cross-sectional shape with small sidewall roughness can be used for manufacturing a semiconductor device. Thus, a semiconductor device having a fine and highly accurate transfer pattern can be manufactured.

According to the reflective mask blank of the present disclosure (the reflective mask manufactured by this reflective mask blank), the film thickness of the phase shift film can be reduced, the shadowing effect can be reduced, and the fine and highly accurate phase shift pattern can be formed in a stable cross-sectional shape with small sidewall roughness. Thus, the reflective mask manufactured by using the reflective mask blank having this structure can form the phase shift pattern itself finely and highly accurately on the mask and at the same time prevent a decrease in the accuracy due to shadowing during transfer. In addition, by performing EUV lithography using this reflective mask, it becomes possible to provide a method of manufacturing a fine and highly accurate semiconductor device.

DESCRIPTION OF EMBODIMENTS

Figure 1:
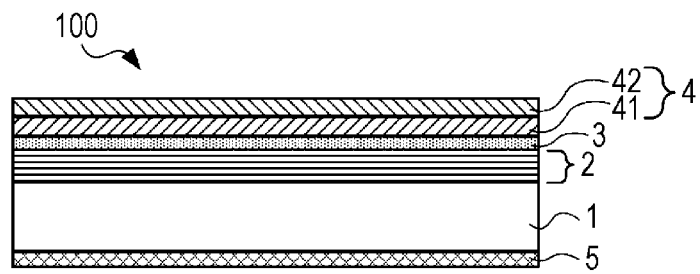
FIG. 1 is a schematic cross-sectional diagram of a main part for describing a schematic configuration of a reflective mask blank of the present disclosure.

Hereinafter, embodiments of the present disclosure will be specifically described with reference to the drawings. Note that each of the following embodiments is one mode for embodying the present disclosure and does not limit the present disclosure within the scope thereof. Note that in the drawings, the same or corresponding parts are denoted by the same reference signs, and description thereof may be simplified or omitted.

<Structure of Reflective Mask Blank 100 and Method of Manufacturing the Same>

FIG. 1 is a schematic cross-sectional diagram of a main part for describing a schematic configuration of a reflective mask blank 100 of the present embodiment. As shown in the figure, the reflective mask blank 100 has a mask blank substrate 1 (also simply referred to as "substrate 1"), a multilayer reflective film 2, a protective film 3, and a phase shift film 4 (a lower layer 41 and an upper layer 42) that are layered in this order. The multilayer reflective film 2 reflects EUV light that is exposure light formed on a side of a first main surface (a front surface). The protective film 3 is provided to protect the multilayer reflective film 2 and is formed of a material having resistance to an etchant and a cleaning liquid used when the phase shift film 4 to be described later is patterned. The phase shift film 4 absorbs EUV light. In addition, a back side conductive film 5 for an electrostatic chuck is formed on a side of a second main surface (a back surface) of the substrate 1.

In the present specification, the expression "having the multilayer reflective film 2 on a main surface of the mask blank substrate 1" means that the multilayer reflective film 2 is arranged in contact with the surface of the mask blank substrate 1, and the expression also includes a meaning of having another film between the mask blank substrate 1 and the multilayer reflective film 2. The same applies to other films. For example, the expression "having a film B on a film A" means that the film A and the film B are arranged so as to be in direct contact with each other, and the expression also includes a meaning of having another film between the film A and the film B. In addition, in the present specification, for example, the expression "the film A is arranged in contact with the surface of the film B" means that the film A and the film B are arranged in direct contact with each other without another film interposed between the film A and the film B.

In the present specification, an expression that the second layer is, for example, "a thin film that includes a material including a metal containing ruthenium (Ru) and chromium (Cr)" means that the second layer includes a thin film including substantially at least a material containing ruthenium (Ru) and chromium (Cr). Meanwhile, an expression that the second layer is "a thin film that includes ruthenium (Ru) and chromium (Cr)" may mean that the second layer includes only ruthenium (Ru) and chromium (Cr). In addition, in any case, the expressions include a meaning that the second layer includes an impurity that is inevitably mixed.

Hereinafter, each layer will be described.

«Substrate 1»

As the substrate 1, a substrate having a low thermal expansion coefficient in the range of 0±5 ppb/° C. is preferably used in order to prevent distortion of a phase shift pattern 4a due to heat during exposure to EUV light. As the material having a low thermal expansion coefficient in this range, for example, $SiO_2$—$TiO_2$-based glass and multicomponent glass ceramics can be used.

In view of obtaining at least pattern transfer accuracy and position accuracy, the first main surface on a side of the substrate 1 where a transfer pattern (constituted by the phase shift film 4 to be described later) is formed has been subjected to a surface treatment so that the first main surface has high flatness. In the case of EUV exposure, flatness in an area of 132 mm×132 mm of the main surface on the side of the substrate 1 where the transfer pattern is formed is preferably 0.1 μm or less, more preferably 0.05 μm or less, and particularly preferably 0.03 μm or less. In addition, the second main surface on a side opposite to the side on which the transfer pattern is formed is a surface to be electrostatically chucked at the time of setting on an exposure apparatus, and the second main surface has preferably a flatness of 0.1 μm or less, more preferably 0.05 μm or less, and particularly preferably 0.03 μm or less in an area of 132 mm×132 mm. Note that flatness in an area of 142 mm×142 mm on a side of the second main surface in the reflective mask blank 100 is preferably 1 μm or less, more preferably 0.5 μm or less, and particularly preferably 0.3 μm or less.

In addition, high surface smoothness of the substrate 1 is also an extremely important item. The surface roughness of the first main surface of the substrate 1 where the phase shift pattern 4a for transfer is formed has preferably a root mean square roughness (RMS) of 0.1 nm or less. Note that the surface smoothness can be measured with an atomic force microscope.

Furthermore, the substrate 1 has preferably high rigidity in order to prevent deformation due to film stress of a film (such as the multilayer reflective film 2) formed on the substrate 1. In particular, the substrate 1 has preferably a high Young's modulus of 65 GPa or more.

«Multilayer Reflective Film 2»

The multilayer reflective film 2 imparts a function that reflects EUV light in a reflective mask 200, and is a multilayer film in which layers each including, as a main component, an element having a different refractive index are periodically layered.

Generally, as the multilayer reflective film 2, there is used a multilayer film in which a thin film (a high refractive index layer) of a light element that is a high refractive index material or a compound of the light element and a thin film (a low refractive index layer) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 1 and by building up a plurality of periods of the stack. In addition, the multilayer film may be formed by counting, as one period, a stack of a low refractive index layer and high refractive index layer in which the low refractive index layer and the high refractive index layer are layered in this order from the substrate 1 and by building up the stack for a plurality of periods. Note that a layer of the outermost surface of the multilayer reflective film 2, that is, a surface layer of the multilayer reflective film 2 on a side opposite to the substrate 1 is preferably a high refractive index layer. In a case where in the multilayer film described above, a stack of a high refractive index layer and a low refractive index layer in which the high refractive index layer and the low refractive index layer are layered in this order from the substrate 1 is counted as one period and the stack is built up for a plurality of periods, the uppermost layer is a low refractive index layer. In this case, if the low refractive index layer constitutes the outermost surface of the multilayer reflective film 2, the low refractive index layer is easily oxidized and the reflectance of the reflective mask 200 is reduced. Thus, it is preferable to further form a high refractive index layer on the low refractive index layer that is the uppermost layer to form the multilayer reflective film 2. Meanwhile, in a case where in the multilayer film described above, a stack of a low refractive index layer and a high refractive index layer in which the low refractive index layer and the high refractive index layer are layered in this order from the substrate 1 is counted as one period and the stack is built up for a plurality of periods, the uppermost layer is a high refractive index layer and this stack is good as is.

In the present embodiment, a layer containing silicon (Si) is employed as the high refractive index layer. As a material containing Si, a Si compound containing Si and boron (B), carbon (C), nitrogen (N), and/or oxygen (O) can be used in addition to Si alone. By using the layer containing Si as the high refractive index layer, the reflective mask 200 for EUV lithography having an excellent reflectance for EUV light can be obtained. In addition, in the present embodiment, a glass substrate is preferably used as the substrate 1. Si also has excellent adhesion to the glass substrate. In addition, as the low refractive index layer, a metal alone selected from molybdenum (Mo), ruthenium (Ru), rhodium (Rh), and platinum (Pt), or an alloy thereof is used. For example, as the multilayer reflective film 2 for EUV light having a wavelength of 13 nm to 14 nm, a Mo/Si periodic film stack in which a Mo film and a Si film are alternately layered for about 40 to 60 periods is preferably used. Note that a high refractive index layer that is the uppermost layer of the multilayer reflective film 2 may be formed using silicon (Si), and a silicon oxide layer containing silicon and oxygen may be formed between the uppermost layer (Si) and the Ru-based protective film 3. Thus, mask cleaning resistance can be improved.

The reflectance of such a multilayer reflective film 2 alone is usually 65% or more, and the upper limit thereof is usually 73%. Note that the film thickness and the period of each constituent layer of the multilayer reflective film 2 need to be appropriately selected according to an exposure wavelength and are selected so as to satisfy the Bragg reflection law. In the multilayer reflective film 2, there are a plurality of high refractive index layers and a plurality of low refractive index layers, but the film thickness does not need to be the same between the high refractive index layers and between the low refractive index layers. In addition, the film thickness of a Si layer of the outermost surface of the multilayer reflective film 2 can be adjusted in a range that does not decrease the reflectance. The film thickness of Si (a high refractive index layer) of the outermost surface can be 3 nm to 10 nm.

A method of forming the multilayer reflective film 2 is publicly known in this technical field. For example, the multilayer reflective film 2 can be formed by forming a film of each layer of the multilayer reflective film 2 by an ion beam sputtering method. In the case of the Mo/Si periodic multilayer film described above, first, a Si film having a thickness of about 4 nm is formed on the substrate 1 using a Si target by, for example, an ion beam sputtering method. Thereafter, a Mo film having a thickness of about 3 nm is formed using a Mo target. This stack of a Si film and a Mo film is counted as one period and the stack is build up for 40 to 60 periods to form the multilayer reflective film 2 (the layer of the outermost surface is a Si layer). In addition, when the multilayer reflective film 2 is formed, it is preferable to form the multilayer reflective film 2 by supplying krypton (Kr) ion particles from an ion source and performing ion beam sputtering.

«Protective Film 3»

The protective film 3 can be formed on the multilayer reflective film 2 or in contact with a surface of the multilayer reflective film 2 in order to protect the multilayer reflective film 2 from dry etching and cleaning in a manufacturing process of the reflective mask 200 to be described later. In addition, the protective film 3 also serves to protect the multilayer reflective film 2 when a black defect of the phase shift pattern 4a is repaired using an electron beam (EB). Here, FIG. 1 shows a case where the protective film 3 is one layer, but the protective film 3 can have a stack of three or more layers. The protective film 3 is formed of a material having resistance to the etchant and the cleaning liquid used when the phase shift film 4 is patterned. The protective film 3 is formed on the multilayer reflective film 2, whereby it is possible to reduce damage to the surface of the multilayer reflective film 2 when the reflective mask 200 (an EUV mask) is manufactured using a substrate with a multilayer reflective film. Thus, a reflectance characteristic of the multilayer reflective film 2 with respect to EUV light is improved.

Hereinafter, the case where the protective film 3 is one layer will be described as an example. Note that in a case where the protective film 3 includes a plurality of layers, properties of a material of the uppermost layer of the protective film 3 (a layer in contact with the phase shift film 4) become important in relation with the phase shift film 4.

In the reflective mask blank 100 of the present embodiment, as a material of the protective film 3, a material having a resistance to an etching gas used for the dry etching for patterning the phase shift film 4 formed on the protective film 3 can be selected. In a case where the phase shift film 4 is formed of a plurality of layers, the material of the protective film 3 in contact with the phase shift film 4 (the uppermost layer of the protective film 3 in a case where the protective film 3 includes a plurality of layers), a material having resistance to an etching gas used for dry etching for patterning the lowermost layer of the phase shift film 4 (a layer in contact with the protective film 3) among layers forming the phase shift film 4 can be selected. The material of the protective film 3 is preferably a material with which an etching selection ratio of the lowermost layer of the phase shift film 4 to the protective film 3 (an etching rate of the lowermost layer of the phase shift film 4/an etching rate of the protective film 3) is 1.5 or more and preferably 3 or more.

For example, in a case where the lowermost layer of the phase shift film 4 is a thin film that includes a material including a metal containing ruthenium (Ru) and at least one or more elements of chromium (Cr), nickel (Ni), and cobalt (Co) (a predetermined Ru-based material) or a material including a metal containing ruthenium (Ru) and at least one or more elements of vanadium (V), niobium (Nb), molybdenum (Mo), tungsten (W), and rhenium (Re) (a predetermined Ru-based material), the lowermost layer of the phase shift film 4 can be etched by a mixed gas of a chlorine-based gas and an oxygen gas or a dry etching gas using an oxygen gas. As the material of the protective film 3 having resistance to this etching gas, a silicon-based material such as silicon (Si), a material containing silicon (Si) and oxygen (O), or a material containing silicon (Si) and nitrogen (N) can be selected. Thus, in a case where the lowermost layer of the phase shift film 4 in contact with a surface of the protective film 3 is a thin film including the predetermined Ru-based material, the protective film 3 preferably includes the silicon-based material described above. The silicon-based material described above has resistance to the mixed gas of a chlorine-based gas and the oxygen gas or the dry etching gas using an oxygen gas, and the resistance increases as the oxygen content increases. Thus, the material of the protective film 3 is more preferably silicon oxide ($SiO_x$, $1 \leq x \leq 2$), more preferably, x is large, and particularly preferably, the material of the protective film 3 is $SiO_2$.

In addition, in a case where the lowermost layer of the phase shift film 4 in contact with the surface of the protective film 3 is a thin film including a material containing tantalum (Ta), the lowermost layer of the phase shift film 4 can be etched by dry etching using a halogen-based gas including no oxygen gas. As a material of the protective film 3 having resistance to this etching gas, a material containing ruthenium (Ru) as a main component can be selected.

In addition, in a case where the lowermost layer of the phase shift film 4 in contact with the surface of the protective film 3 is a thin film including a material containing chromium (Cr), the lowermost layer of the phase shift film 4 can be etched by dry etching using a dry etching gas that is a chlorine-based gas including no oxygen gas or a mixed gas of an oxygen gas and a chlorine-based gas. As a material of the protective film 3 having resistance to this etching gas, a material containing ruthenium (Ru) as a main component can be selected as in a case where the material containing tantalum (Ta) described above is used for the lowermost layer of the phase shift film 4.

The material of the protective film 3 that can be used in a case where the lowermost layer of the phase shift film 4 is a material containing tantalum (Ta) or chromium (Cr) is a material containing ruthenium as a main component as described above. As the material containing ruthenium as a main component, a Ru metal alone, a Ru alloy containing Ru and at least one kind of a metal selected from titanium (Ti), niobium (Nb), molybdenum (Mo), zirconium (Zr), yttrium (Y), boron (B), lanthanum (La), cobalt (Co), rhenium (Re), and the like, and a material containing a Ru metal or a Ru alloy and nitrogen can specifically be mentioned.

In addition, the material of the protective film 3 can be formed of a material including a metal containing ruthenium (Ru) and at least one or more elements of cobalt (Co), niobium (Nb), molybdenum (Mo), and rhenium (Re), which is the same material as a material of a layer above the lowermost layer of the phase shift film 4 (for example, the upper layer 42).

In addition, in a case where the lowermost layer of the phase shift film 4 is a material containing tantalum (Ta) or chromium (Cr), the protective film 3 can be, for example, one in which the lowermost layer and the uppermost layer of the protective film 3 are layers including a material containing ruthenium as a main component, and a metal or an alloy other than Ru is interposed between the lowermost layer and the uppermost layer.

The Ru content ratio of this Ru alloy is 50 atomic % or more and less than 100 atomic %, preferably 80 atomic % or more and less than 100 atomic %, and more preferably 95 atomic % or more and less than 100 atomic %. In particular, in a case where the Ru content ratio of the Ru alloy is 95 atomic % or more and less than 100 atomic %, it is possible to combine the functions of the protective film 3 such as mask cleaning resistance, an etching stopper function when the phase shift film 4 is etched, and the prevention of a change of the multilayer reflective film 2 with time while the diffusion of a constituent element (silicon) of the multilayer reflective film 2 into the protective film 3 is reduced and the reflectance for EUV light is sufficiently secured.

In EUV lithography, since there are few substances that are transparent to exposure light, it is not technically easy to apply an EUV pellicle that prevents foreign matters from adhering to a mask pattern surface. For this reason, pellicle-less operation without using a pellicle has been the mainstream. In addition, in the EUV lithography, exposure contamination such as carbon film deposition on a mask or oxide film growth due to EUV exposure occurs. Thus, it is necessary to frequently clean and remove foreign matters and contamination on an EUV reflective mask at a stage where the mask is used for manufacturing a semiconductor device. Therefore, the EUV reflective mask is required to have extraordinary mask cleaning resistance as compared with a transmissive mask for optical lithography. The reflective mask 200 has the protective film 3, whereby cleaning resistance to the cleaning liquid can be increased.

The film thickness of the protective film 3 is not particularly limited as long as the function of protecting the multilayer reflective film 2 is fulfilled. From the viewpoint of the reflectance for EUV light, the film thickness of the protective film 3 is preferably 1.0 nm to 8.0 nm and more preferably 1.5 nm to 6.0 nm.

As a method of forming the protective film 3, it is possible to adopt a film forming method similar to a publicly known one without any particular limitation. As specific examples, a sputtering method and an ion beam sputtering method can be mentioned.

«Phase Shift Film 4»

The phase shift film 4 that shifts a phase of EUV light is formed on the protective film 3. In a part where the phase shift film 4 (the phase shift pattern 4a) is formed, part of light is reflected at a level that does not adversely affect pattern transfer while EUV light is absorbed and reduced. Meanwhile, EUV light is reflected from the multilayer reflective film 2 through the protective film 3 at an opening (a part where the phase shift film 4 is not present). The reflected light from the part where the phase shift film 4 is formed forms a desired phase difference with respect to the reflected light from the opening. The phase shift film 4 is formed so that a phase difference between the reflected light from the phase shift film 4 and reflected light from the multilayer reflective film 2 is 160 degrees to 200 degrees. Beams of the light having reversed phase differences in the neighborhood of 180 degrees interfere with each other at a pattern edge portion, whereby the image contrast of a projected optical image is improved. As the image contrast is improved, resolution is increased, and various exposure-related margins such as an exposure margin and a focus margin increase. Generally, a measure of the reflectance of the phase shift film 4 for obtaining this phase shift effect is 2% or more in terms of relative reflectance, though the measure depends on pattern and exposure conditions. The reflectance of the phase shift film 4 is preferably 6% or more in terms of relative reflectance in order to obtain a sufficient phase shift effect. In addition, in a case where the relative reflectance is high to be 10% or more and more preferably 15% or more, the phase difference can be 130 degrees to 160 degrees or 200 degrees to 230 degrees in order to further improve the contrast. Here, the relative reflectance of the phase shift film 4 (the phase shift pattern 4a) is reflectance for EUV light reflected from the phase shift pattern 4a when reflectance for EUV light reflected from the multilayer reflective film 2 (including the multilayer reflective film 2 with the protective film 3) in a part where the phase shift pattern 4a is not present is assumed to be 100%. Note that in this specification, the relative reflectance may be simply referred to as "reflectance".

In addition, the absolute reflectance of the phase shift film 4 is preferably 9% or more in order to obtain a sufficient phase shift effect. Here, the absolute reflectance of the phase shift film 4 (the phase shift pattern 4a) means reflectance for EUV light reflected from the phase shift film 4 (or the phase shift pattern 4a) (a ratio of incident light intensity and reflected light intensity).

The relative reflectance of the phase shift pattern 4a is preferably 6% to 40% in order to further improve resolution and throughput when a semiconductor device is manufactured. The relative reflectance of the phase shift pattern 4a is required to be more preferably 6 to 35%, still more preferably 15% to 35%, and still more preferably 15% to 25%.

The absolute reflectance of the phase shift film 4 (or the phase shift pattern 4a) is desired to be 4% to 27% and more preferably 10% to 17% in order to further improve the resolution and the throughput when a semiconductor device is manufactured.

The phase shift film 4 of the present embodiment has a first layer and a second layer. The first layer includes a material containing at least one or more elements of tantalum (Ta) and chromium (Cr). The second layer includes a material including a metal containing ruthenium (Ru) and at least one or more elements of chromium (Cr), nickel (Ni), cobalt (Co), vanadium (V), niobium (Nb), molybdenum (Mo), tungsten (W), and rhenium (Re).

The phase shift film 4 of the reflective mask blank 100 of the present embodiment includes the first layer and the second layer including the predetermined materials, whereby the phase shift pattern 4a having a relative reflectance of 6% to 40% can be obtained. The predetermined materials are used for the phase shift film 4 of the reflective mask blank 100 of the present embodiment, whereby an absolute reflectance of 4% to 27% can be obtained. In addition, the phase shift film 4 of the reflective mask blank 100 of the present embodiment has thin film thickness necessary for obtaining a predetermined phase difference (a phase difference between the reflected light from the opening and the reflected light from the phase shift pattern 4a). Thus, a shadowing effect generated by the phase shift pattern 4a can be further reduced in the reflective mask 200. In addition, the reflective mask 200 manufactured from the reflective mask blank 100 of the present embodiment is used, whereby it is possible to improve the throughput when a semiconductor device is manufactured.

The first layer of the phase shift film 4 of the reflective mask blank 100 of the present embodiment will be described. The first layer includes a material containing at least one or more elements of tantalum (Ta) and chromium (Cr).

As the material of the first layer containing tantalum (Ta), a material containing tantalum (Ta) and one or more elements selected from oxygen (O), nitrogen (N), carbon (C), boron (B), and hydrogen (H) can be mentioned. Among these, the material of the first layer is particularly preferably a material containing tantalum (Ta) and nitrogen (N). As specific examples of such a material, tantalum nitride (TaN), tantalum oxynitride (TaON), tantalum boride nitride (TaBN), and tantalum boride oxynitride (TaBON) can be mentioned.

In a case where the first layer contains Ta and N, the composition range of Ta and N (the atomic ratio, Ta:N) is preferably 3:1 to 20:1 and more preferably 4:1 to 12:1. In addition, the film thickness is preferably 2 to 55 nm and more preferably 2 to 30 nm.

As the material of the first layer containing chromium (Cr), a material containing chromium (Cr) and one or more elements selected from oxygen (O), nitrogen (N), carbon (C), boron (B), and hydrogen (H) can be mentioned. Among these, the material of the first layer is particularly preferably a material containing chromium (Cr) and carbon (C). As specific examples of such a material, chromium nitride (CrC), chromium oxynitride (CrOC), chromium carbonitride (CrCN), and chromium oxycarbonitride (CrOCN) can be mentioned.

In a case where the first layer contains Cr and C, the composition range of Cr and C (the atomic ratio, Cr:C) is preferably 5:2 to 20:1 and more preferably 3:1 to 12:1. In addition, the film thickness is preferably 2 to 55 nm and more preferably 2 to 25 nm.

In addition, the ranges of a refractive index n and an extinction coefficient k in a case where the phase difference of the phase shift film 4 is 160 degrees to 200 degrees are as follows. In a case where the relative reflectance of the phase shift film 4 is 6% to 40% or the absolute reflectance thereof is 4% to 27%, the refractive index n of the first layer including the material containing at least one or more elements of tantalum (Ta) and chromium (Cr) for EUV light is preferably 0.930 to 0.960 and the extinction coefficient k thereof is preferably 0.020 to 0.041. In a case where the relative reflectance is 6% to 35% or the absolute reflectance is 4% to 23%, the refractive index n of the first layer for EUV light is preferably 0.930 to 0.960 and the extinction coefficient k thereof is preferably 0.023 to 0.041. In a case where the relative reflectance is 15% to 35% or the absolute reflectance is 10% to 23%, the refractive index n of the first layer for EUV light is preferably 0.930 to 0.950, and the extinction coefficient k thereof is preferably 0.023 to 0.033. In a case where the relative reflectance is 15% to 25% or the absolute reflectance is 10% to 17%, the refractive index n of the first layer for EUV light is preferably 0.935 to 0.950, and the extinction coefficient k thereof is preferably 0.026 to 0.033.

In addition, the ranges of the refractive index n and the extinction coefficient k in a case where the phase difference of the phase shift film 4 is 130 degrees to 160 degrees are as follows. In a case where the relative reflectance of the phase shift film 4 is 10% to 40% or the absolute reflectance thereof is 6.7% to 27%, the refractive index n of the first layer including the material containing at least one or more elements of tantalum (Ta) and chromium (Cr) for EUV light is preferably 0.930 to 0.960 and the extinction coefficient k thereof is preferably 0.025 to 0.046.

In addition, the ranges of the refractive index n and the extinction coefficient k in a case where the phase difference of the phase shift film 4 is 200 degrees to 230 degrees are as follows. In a case where the relative reflectance of the phase shift film 4 is 10% to 40% or the absolute reflectance thereof is 6.7% to 27%, the refractive index n of the first layer for EUV light is preferably 0.930 to 0.960 and the extinction coefficient k thereof is preferably 0.015 to 0.036.

The second layer of the phase shift film 4 of the reflective mask blank 100 of the present embodiment (hereinafter, may be simply referred to as "predetermined Ru-based material") will be described. The second layer includes a material including a metal containing ruthenium (Ru) and at least one or more elements of chromium (Cr), nickel (Ni), cobalt (Co), vanadium (V), niobium (Nb), molybdenum (Mo), tungsten (W), and rhenium (Re).

The refractive index n of Ru is n=0.886 (the extinction coefficient k=0.017), and Ru is preferable as a material for the phase shift film 4 having high reflectance. However, a Ru-based compound such as RuO is likely to have a crystallized structure and has poor processing characteristics. That is, the crystal grain of a crystallized metal is likely to cause large sidewall roughness when the phase shift pattern 4a is formed. Thus, this may have an adverse effect when the predetermined phase shift pattern 4a is formed. Meanwhile, in a case where a metal of the material of the phase shift film 4 is amorphous, it is possible to reduce the adverse effect when the phase shift pattern 4a is formed. By adding a predetermined element (X) to Ru, the metal of the material of the phase shift film 4 can be made amorphous and the processing characteristics can be improved. As the predetermined element (X), at least one or more of Cr, Ni, Co, V, Nb, Mo, W, and Re can be selected.

Note that the refractive index n and the extinction coefficient k of Ni are n=0.948 and k=0.073, respectively. In addition, as for Co, n=0.933 and k=0.066, and as for Cr, n=0.932 and k=0.039. In addition, the refractive index n and the extinction coefficient k of V are n=0.944 and k=0.025, respectively. The refractive index n and the extinction coefficient k of Nb are n=0.933 and k=0.005, respectively. The refractive index n and the extinction coefficient k of Mo are n=0.923 and k=0.007, respectively. The refractive index n and the extinction coefficient k of W are n=0.933 and k=0.033, respectively. The refractive index n and the extinction coefficient k of Re are n=0.914 and k=0.04, respectively. With binary materials (RuCr, RuNi, and RuCo) obtained by adding the predetermined element (X) to Ru, it is possible to make the film thickness of the phase shift film 4 thinner than that in the case of RuTa that is a conventional material. In addition, since the extinction coefficients k of Ni and Co are each larger than the extinction coefficient k of Cr, when Ni and/or Co is selected as the element (X), the film thickness of the phase shift film 4 can be made thinner than when Cr is selected.

In addition, the ranges of a refractive index n and an extinction coefficient k in a case where the phase difference of the phase shift film 4 is 160 degrees to 200 degrees are as follows. In a case where the relative reflectance of the phase shift film 4 is 6% to 40% or the absolute reflectance thereof is 4% to 27%, the refractive index n of the second layer including the material obtained by adding the predetermined element (X) to Ru for EUV light is preferably is 0.860 to 0.950 and the extinction coefficient k thereof is preferably 0.008 to 0.095. In a case where the relative reflectance is 6% to 35% or the absolute reflectance is 4% to 23%, the refractive index n of the second layer for EUV light is preferably 0.860 to 0.950 and the extinction coefficient k thereof is preferably 0.008 to 0.095. In a case where the relative reflectance is 15% to 35% or the absolute reflectance is 10% to 23%, the refractive index n is preferably 0.860 to 0.950 and the extinction coefficient k thereof is preferably 0.008 to 0.050. In a case where the relative reflectance is 15% to 25% or the absolute reflectance is 10% to 17%, the refractive index n of the second layer for EUV light is preferably 0.890 to 0.950, and the extinction coefficient k thereof is preferably 0.020 to 0.050.

In addition, the ranges of the refractive index n and the extinction coefficient k in a case where the phase difference of the phase shift film 4 is 130 degrees to 160 degrees are as follows. In a case where the relative reflectance of the phase shift film 4 is 10% to 40% or the absolute reflectance thereof is 6.7% to 27%, the refractive index n of the second layer including the material obtained by adding the predetermined element (X) to Ru for EUV light is preferably 0.860 to 0.950 and the extinction coefficient k thereof is preferably 0.009 to 0.095. In a case where the relative reflectance is 15% to 35% or the absolute reflectance is 10% to 23%, the refractive index n of the second layer for EUV light is preferably 0.860 to 0.950 and the extinction coefficient k thereof is preferably 0.01 to 0.073.

In addition, the ranges of the refractive index n and the extinction coefficient k in a case where the phase difference of the phase shift film 4 is 200 degrees to 230 degrees are as follows. In a case where the relative reflectance of the phase shift film 4 is 10% to 40% or the absolute reflectance thereof is 6.7% to 27%, the refractive index n of the second layer for EUV light is preferably 0.860 to 0.940 and the extinction coefficient k thereof is preferably 0.008 to 0.057. In a case where the relative reflectance is 15% to 35% or the absolute reflectance is 10% to 23%, the refractive index n of the second layer for EUV light is preferably 0.860 to 0.939 and the extinction coefficient k thereof is preferably 0.009 to 0.045.

The phase difference and the reflectance of the phase shift film 4 can be adjusted by changing the refractive index n, the extinction coefficient k, the film thickness of the first layer and the film thickness of the second layer. The film thickness of the first layer is preferably 55 nm or less and more preferably 30 nm or less. The film thickness of the first layer is preferably 2 nm or more. In addition, the film thickness of the second layer is preferably 50 nm or less and more preferably 35 nm or less. The film thickness of the second layer is preferably 5 nm or more and more preferably 15 nm or more. The film thickness of the phase shift film 4 (total film thickness of the first layer and the second layer) is preferably 60 nm or less, more preferably 50 nm or less, and still more preferably 40 nm or less. The film thickness of the phase shift film 4 is preferably 25 nm or more. Note that in a case where the protective film 3 is included, the phase difference and the reflectance of the phase shift film 4 can also be adjusted in consideration of the refractive index n, the extinction coefficient k, and the film thickness of the protective film 3.

The binary materials (RuCr, RuNi, and RuCo) obtained by adding the predetermined element (X) to Ru have better processing characteristics than those of RuTa that is a conventional material. When Ta is oxidized, it is difficult to etch by a chlorine-based gas and an oxygen gas. In particular, since RuCr can be easily etched by a mixed gas of a chlorine-based gas and an oxygen gas, RuCr is excellent in processing characteristics. In addition, in a case where the material of the first layer contains Cr, the first layer and the second layer can be etched by the same dry etching gas.

The binary materials (RuCr, RuNi, and RuCo) obtained by adding the predetermined element (X) to Ru have an amorphous structure and can be easily etched by a mixed gas of a chlorine-based gas and an oxygen gas. In addition, these materials can be etched by an oxygen gas. The same is thought to apply to ternary materials (RuCrNi, RuCrCo, and RuNiCo) and a quaternary material (RuCrNiCo).

In addition to the binary materials described above, binary materials (RuV, RuNb, RuMo, RuW, and RuRe) obtained by adding V, Nb, Mo, W or Re to Ru have better workability than that of RuTa that is a conventional material. RuW and RuMo are particularly excellent in processing characteristics as with RuCr.

In addition, the binary materials (RuV, RuNb, RuMo, RuW, and RuRe) obtained by adding the predetermined element (X) to Ru have an amorphous structure and can be easily etched by a mixed gas of a chlorine-based gas and an oxygen gas. In addition, these materials can be etched by an oxygen gas. The same is thought to apply to ternary materials and quaternary materials.

Next, the mixing ratio of Ru and the predetermined element (X) will be described regarding the predetermined Ru-based material.

Figure 3:
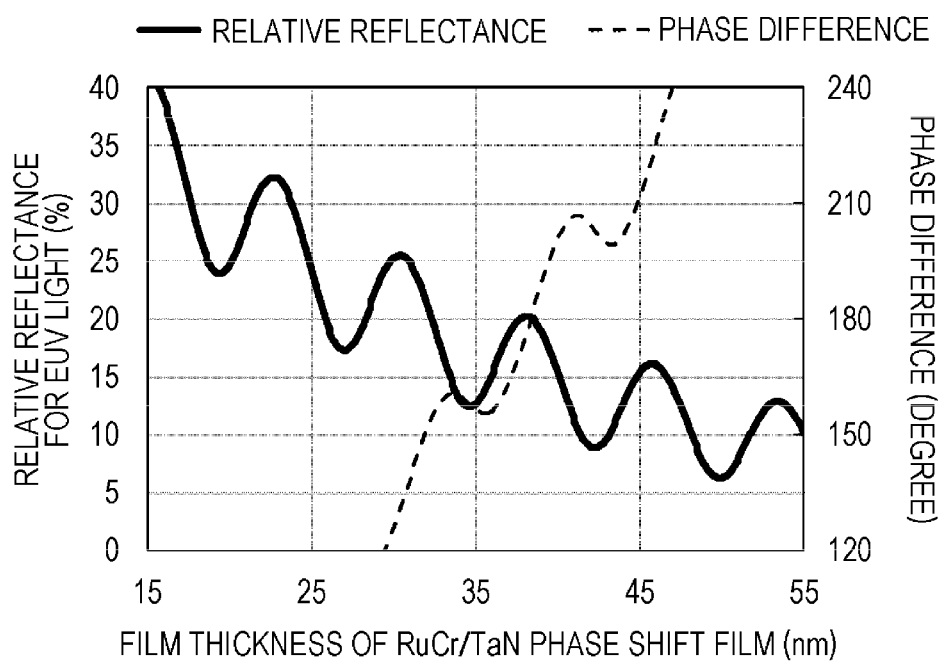
FIG. 3 is a graph showing a relationship between the film thickness of a phase shift film, relative reflectance with respect to light having a wavelength of 13.5 nm, and a phase difference.

The relative reflectance and absolute reflectance of the predetermined Ru-based material increase as Ru content increases. In addition, reflected light of the phase shift film 4 is light generated by superposition of surface reflected light from the surface of the phase shift film 4 and back surface reflected light at a back surface of the phase shift film 4 (an interface between the phase shift film 4 and the protective film 3 or the multilayer reflective film 2) after passing through the phase shift film 4. Thus, the intensity of the reflected light of the phase shift film 4 has a periodic structure depending on the film thickness of the phase shift film 4. As a result, the reflectance and the phase difference of the phase shift film 4 also show a periodic structure depending on the film thickness, as shown as an example in FIG. 3. Note that FIG. 3 is a graph showing a relationship between the film thickness of the phase shift film 4, the relative reflectance with respect to EUV light, and the phase difference when the film thickness of the lower layer 41 (a TaN film) is fixed to 15.5 nm and the film thickness of the upper layer 42 (a RuCr film) is changed in a case where the phase shift film 4 includes two layers, that is, the lower layer 41 that is the TaN film and the upper layer 42 that is the RuCr film, and the atomic ratio of Ru and Cr in the RuCr film is Ru:Cr=90:10. The refractive index n and the extinction coefficient k of the material of the phase shift film 4 affect the periodic structure. Meanwhile, the reflected light from the phase shift pattern 4a needs to have a predetermined phase difference (for example, a phase difference of 180 degrees) with respect to the reflected light from the opening. In comprehensive consideration of the above, a relationship between the relative reflectance of the phase shift film 4, and the composition and the film thickness of the predetermined Ru-based material was studied. As a result, regarding the composition and the film thickness of the predetermined Ru-based material, preferable ranges can be shown according to the relative reflectance of the phase shift film 4, as described below. As shown in FIG. 3, in a case where the lower layer 41 of the phase shift film 4 is the TaN film with a film thickness of 15.5 nm and the upper layer 42 is the RuCr film (Ru:Cr=90:10), the film thickness of the RuCr film is 22.8 nm (the film thickness of the phase shift film 4 is 38.3 nm), the relative reflectance with respect to the multilayer reflective film (with a protective film) is 20.1% (the absolute reflectance is 13.4%), and the phase difference is approximately 180 degrees.

Specifically, the following describes a relationship between the composition (the atomic ratio) of the predetermined Ru-based material and the film thickness in a case where when the phase shift film 4 includes the two layers, that is, the first layer and the second layer, and the first layer of the phase shift film 4 includes the material containing at least one or more elements of tantalum (Ta) and chromium (Cr), the relative reflectance of the second layer material is 6% to 40%.

That is, in a case where the material of the second layer contains Ru and Cr, the composition range (the atomic ratio) of Ru and Cr is preferably Ru:Cr=40:1 to 1:20 and more preferably 40:1 to 3:7. In addition, the film thickness is preferably 5 to 50 nm and more preferably 15 to 35 nm.

In a case where the material of the second layer contains Ru and Ni, the composition range (the atomic ratio) of Ru and Ni is preferably Ru:Ni=40:1 to 1:6 and more preferably 40:1 to 1:1. In addition, the film thickness is preferably 5 to 45 nm and more preferably 12 to 33 nm.

In a case where the material of the second layer contains Ru and Co, the composition range (the atomic ratio) of Ru and Co is preferably Ru:Co=40:1 to 1:7 and more preferably 40:1 to 2:3. In addition, the film thickness is preferably 5 to 40 nm and more preferably 10 to 30 nm.

In a case where the material of the second layer contains Ru and V, the composition range (the atomic ratio) of Ru and V is preferably Ru:V=40:1 to 1:20 and more preferably 40:1 to 2:7. In addition, the film thickness is preferably 5 to 60 nm and more preferably 16 to 50 nm.

In a case where the material of the second layer contains Ru and Nb, the composition range (the atomic ratio) of Ru and Nb is preferably Ru:Nb=40:1 to 5:1 and more preferably 40:1 to 9:1. In addition, the film thickness is preferably 5 to 33 nm and more preferably 16 to 33 nm.

In a case where the material of the second layer contains Ru and Mo, the composition range (the atomic ratio) of Ru and Mo is preferably Ru:Mo=40:1 to 4:1 and more preferably 40:1 to 9:1. In addition, the film thickness is preferably 5 to 33 nm and more preferably 15 to 33 nm.

In a case where the material of the second layer contains Ru and W, the composition range (the atomic ratio) of Ru and W is preferably Ru:W=40:1 to 1:20 and more preferably 40:1 to 17:33. In addition, the film thickness is preferably 5 to 50 nm and more preferably 16 to 40 nm.

In a case where the material of the second layer contains Ru and Re, the composition range (the atomic ratio) of Ru and Re is preferably Ru:Re=40:1 to 1:20 and more preferably 40:1 to 9:16. In addition, the film thickness is preferably 5 to 38 nm and more preferably 16 to 33 nm.

As described above, the composition ratios of Ru to Cr, Ni, Co, V, Nb, Mo, W, and Re are in the predetermined ranges, whereby it is possible to obtain the second layer for obtaining the phase shift film 4 having high reflectance and the predetermined phase difference at thin film thickness.

In the above description, the predetermined Ru-based binary materials have been mainly described, but the ternary materials (RuCrNi, RuCrCo, RuNiCo, and RuCrW) and the quaternary materials (RuCrNiCo and RuCrCoW) also have properties similar to those of the predetermined Ru-based binary materials. Thus, the ternary or quaternary material can be used as the predetermined Ru-based material.

The predetermined Ru-based material can include Ru and at least one or more elements of Cr, Ni, Co, V, Nb, Mo, W, and Re, and further, other elements, in a range that does not significantly affect the refractive index and the extinction coefficient. The predetermined Ru-based material can include an element, for example, nitrogen (N), oxygen (O), carbon (C), or boron (B). For example, the addition of nitrogen (N) to the predetermined Ru-based material can reduce the oxidation of the phase shift film 4, so that the properties of the phase shift film 4 can be stabilized. In addition, in a case where nitrogen (N) is added to the predetermined Ru-based material, a crystalline state can be easily changed into an amorphous state regardless of the film forming conditions of sputtering. In this case, nitrogen content is preferably 1 atomic % or more and more preferably 3 atomic % or more. In addition, the nitrogen content is preferably 10 atomic % or less. Oxygen (O), carbon (C), boron (B), and the like can also be added to the material of the phase shift film 4 in a range that does not significantly affect the refractive index and the extinction coefficient for stabilization of the phase shift film 4 and the like. In a case where the material of the phase shift film 4 contains Ru and at least one or more elements of Cr, Ni, Co, V, Nb, Mo, W, and Re, and other elements, the content of the other elements described above is preferably 10 atomic % or less and more preferably 5 atomic % or less.

The phase shift film 4 including the predetermined Ru-based material described above can be formed by a known method such as a magnetron sputtering method including a direct-current (DC) sputtering method and a radio-frequency (RF) sputtering method. In addition, an alloy target of Ru and at least one or more elements of Cr, Ni, Co, V, Nb, Mo, W, and Re can be used as a target.

In addition, a Ru target, a Cr target, a Ni target, a Co target, a V target, a Nb target, a Mo target, a W target and/or a Re target can be used as a target to form a film by co-sputtering. The co-sputtering has an advantage that the composition ratio of metal elements can be easily adjusted, but the crystalline state of the film may easily turn into a columnar structure state as compared with the alloy target. The crystalline state can be changed into an amorphous state by forming the film so as to include nitrogen (N) therein during sputtering.

In this specification, in a case where the phase shift film 4 includes two layers, a layer in contact with the multilayer reflective film 2 or the protective film 3 is referred to as the lower layer 41, and a layer arranged on the surface of the phase shift film 4 on a side opposite to the multilayer reflective film 2 or the protective film 3 is referred to as the upper layer 42. In a case where the phase shift film 4 includes three or more layers, generally, the lower layer 41 is arranged at any position on a side that is away from the upper layer 42 and on which the multilayer reflective film 2 or the protective film 3 is present. Note that the lower layer 41 can be the lowermost layer of the phase shift film 4 (a layer in contact with the multilayer reflective film 2 or the protective film 3 among layers forming the phase shift film 4), and the upper layer 42 can be the uppermost layer of the phase shift film 4 (a layer farthest from the lowermost layer among layers forming the phase shift film 4). In the following description, each of the first layer and the second layer is either the upper layer 42 or the lower layer 41. That is, in a case where the first layer including the predetermined material is the upper layer 42, the second layer including the predetermined material is the lower layer 41, and in a case where the first layer including the predetermined material is the lower layer 41, the second layer including the predetermined material is the upper layer 42.

The phase shift film 4 can include only the two layers, that is, the first layer and the second layer described above. In addition, the phase shift film 4 can include a film other than the first layer and the second layer. In the present embodiment, the phase shift film 4 preferably includes only the two layers, that is, the first layer and the second layer described above. In a case where the phase shift film 4 includes only the two layers, that is, the first layer and the second layer, the number of steps in manufacturing the mask blank can be reduced, so that the production efficiency is improved.

In addition, in a case where the phase shift film 4 includes two or more layers, the film thickness is adjusted without changing the composition of either one of the first layer and the second layer or the composition of the first layer and the second layer, whereby the reflectance and the phase difference can be changed.

In a case where the phase shift film 4 includes three or more layers, the phase shift film 4 can have a stack of three or more first layers and second layers alternately layered. The film thickness of the first layer and the second layer is adjusted, whereby it is possible to improve the stability of the phase difference and the reflectance with respect to film thickness variations. In addition, the uppermost layer of the phase shift film 4 is the second layer, whereby the cleaning resistance can be improved.

The phase shift film 4 can include three or more layers, as described above. However, for ease of description, the arrangement of the first layer and the second layer will be described by taking, as an example, a case where the phase shift film 4 includes the two layers, that is, the first layer and the second layer. In addition, in the following example, a case where the reflective mask blank 100 has the protective film 3 will be described. As described below, it is preferable to appropriately select the type of the material of the protective film 3 and arrange the first layer and the second layer in consideration of the type of the material of the protective film 3 and which of the first layer and the second layer is the lower layer 41. This is because the type of dry etching gas that can be used for dry etching and the type of dry etching gas having resistance to dry etching differ depending on the type of material.

Hereinafter, first, the etching characteristics of the first layer, the second layer, and the protective film 3 will be described.

In a case where the first layer is the material containing tantalum (Ta), the first layer can be patterned by the dry etching gas including a halogen-based gas including no oxygen gas.

In a case where the first layer is the material containing chromium (Cr), the first layer can be patterned by a chlorine-based dry etching gas. The chlorine-based dry etching gas can include an oxygen gas or may not include an oxygen gas.

The second layer including the predetermined Ru-based material can be patterned by a dry etching gas including oxygen. As the dry etching gas, for example, a gas of an oxygen alone or a gas including an oxygen gas and a chlorine-based gas can be used.

In a case where the material of the protective film 3 is the material containing silicon (Si), the material containing silicon (Si) and oxygen (O), or the material containing silicon (Si) and nitrogen (N), the protective film 3 has resistance to dry etching using a mixed gas of a chlorine-based gas and an oxygen gas or a dry etching gas using an oxygen gas. Note that this dry etching gas can etch the second layer including the predetermined Ru-based material.

In a case where the material of the protective film 3 is the material containing ruthenium (Ru) as a main component, the protective film 3 has resistance to dry etching using a halogen-based gas including no oxygen gas. Note that the dry etching gas can etch the first layer containing tantalum (Ta).

In a case where the material of the protective film 3 is the material containing ruthenium (Ru) as a main component, the protective film 3 has resistance to dry etching using a dry etching gas including a chlorine-based gas including no oxygen gas or a dry etching gas including a chlorine-based gas including a reduced oxygen gas. This dry etching gas can etch the first layer containing chromium (Cr).

From the etching characteristics of the first layer, the second layer, and the protective film 3 described above, the type of the material of the protective film 3 and the arrangement of the first layer and the second layer are preferably as follows.

In a case where the protective film 3 includes the material containing ruthenium (Ru), the first layer and the second layer are preferably layered in this order on the protective film 3. The first layer containing tantalum (Ta) and/or chromium (Cr) is arranged between the protective film 3 containing ruthenium (Ru) and the second layer, whereby an etching gas having resistance to the protective film 3 containing ruthenium (Ru) can be used when the first layer of the phase shift film 4 is etched.

In a case where the protective film 3 is the silicon-based material including the material containing silicon (Si) and oxygen (O) or the material containing silicon (Si) and nitrogen (N), the second layer and the first layer are preferably layered in this order on the protective film 3. The second layer containing ruthenium (Ru) is arranged on the protective film 3 including the silicon-based material, whereby an etching gas having resistance to the protective film 3 including the silicon-based material can be used when the second layer containing ruthenium (Ru) of the phase shift film 4 is etched.

In a case where the first layer of the phase shift film 4 is the material containing tantalum (Ta), the first layer can be patterned by the dry etching gas including a halogen-based gas including no oxygen gas. In addition, the second layer can be patterned by a dry etching gas including a chlorine-based gas and an oxygen gas. This is because the material of the first layer containing tantalum (Ta) has resistance to the dry etching gas including a chlorine-based gas and an oxygen gas, and the material of the second layer has resistance to a dry etching gas including no oxygen gas. In this case, the material of the protective film 3 needs to be appropriately selected, depending on which of the first layer and the second layer is in contact with the protective film 3 (which of the first layer and the second layer is the lower layer 41). That is, in a case where the first layer is the lower layer 41, the material containing ruthenium (Ru) as a main component can be used as the protective film 3. In addition, in a case where the second layer is the lower layer 41, the silicon-based material, particularly the material containing silicon (Si) and oxygen (O) can be used as the protective film 3.

In a case where the first layer of the phase shift film 4 is the material containing chromium (Cr), the second layer can be patterned by a dry etching gas including an oxygen gas, and the first layer can be patterned by a dry etching gas including a chlorine-based gas including no oxygen gas. In this case, the material of the protective film 3 needs to be appropriately selected, depending on which of the first layer and the second layer is in contact with the protective film 3 (which of the first layer and the second layer is the lower layer 41). That is, in a case where the first layer is the lower layer 41, the material containing ruthenium (Ru) as a main component can be used as the protective film 3. In addition, in a case where the second layer is the lower layer 41, the silicon-based material, particularly the material containing silicon (Si) and oxygen (O) can be used as the protective film 3. The first layer containing chromium (Cr) and the second layer containing ruthenium (Ru) are etched by different dry etching gases, whereby the phase shift film 4 can be patterned finely and highly accurately.

In a case where the first layer of the phase shift film 4 is the material containing chromium (Cr), the second layer and the first layer can be patterned by a dry etching gas including a chlorine-based gas and an oxygen gas. In this case, both of the first layer and the second layer can be etched by a single etching step. Thus, the phase shift film 4 can be patterned at appropriate throughput. In this case, the flow rate ratio of the chlorine-based gas to the oxygen-based gas is preferably 3:1 to 10:1.

As the protective film 3, it is preferable to use a silicon-based material having resistance to a dry etching gas of a mixed gas of a chlorine-based gas and an oxygen gas, particularly a material containing silicon (Si) and oxygen (O). As the protective film 3, the material containing ruthenium (Ru) as a main component can be used, but in this case, it is necessary to reduce the oxygen gas in the mixed gas so that the protective film 3 is not etched by the dry etching gas. Thus, in that case, the flow rate ratio of the chlorine-based gas to the oxygen gas is preferably 10:1 to 40:1.

Note that even if the material of the protective film 3 is a material other than the materials described above, it is possible to select a material with which an etching selection ratio of the phase shift film 4 to the protective film 3 in the dry etching using a predetermined dry etching gas (an etching rate of the phase shift film 4/an etching rate of the protective film 3) is 1.5 or more and preferably 3 or more.

As the halogen-based gas used in the dry etching described above, a fluorine-based gas and/or a chlorine-based gas can be used. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, and the like can be used. As the chlorine-based gas, $Cl_2$, $SiCl_4$, $CHCl_3$, $CCl_4$, $BCl_3$, and the like can be used. In addition, a mixed gas including a fluorine-based gas and/or a chlorine-based gas and $O_2$ in a predetermined ratio can be used, if necessary. These etching gases can further include an inert gas such as He and/or Ar, if necessary.

Since EUV light has a short wavelength, the phase difference and the reflectance tend to depend greatly on the film thickness. Thus, the stability of the phase difference and the reflectance with respect to the film thickness variations of the phase shift film 4 is required. However, as shown in FIG. 3, the phase difference and the reflectance each show a vibrating structure with respect to the film thickness of the phase shift film 4. Since the vibrating structures of the phase difference and the reflectance are different, it is difficult to have the film thickness at which the phase difference and the reflectance are stabilized at the same time.

Therefore, even if the film thickness of the phase shift film 4 slightly varies with respect to a design value (for example, in the range of ±0.5% with respect to design film thickness), as for the phase difference, variations in the phase difference between the surfaces are desired to be in the range of the predetermined phase difference±2 degrees (for example, in a case where the phase difference is 180 degrees, in the range of 180 degrees±2 degrees), and as for the reflectance, variations in the reflectance between the surfaces are desired to be in the range of the predetermined reflectance±0.2% (for example, in a case where the relative reflectance is 6%, in the range of 6%±0.2%).

The upper layer 42 of the phase shift film 4 may be thinned at the time of removing and/or cleaning a resist film and an etching mask film, and therefore in a case where focus is on reducing variations in the phase difference of the phase shift film 4, it is preferable to arrange, the second layer having a large contribution to the phase difference as the lower layer 41.

In addition, in a case where the phase shift film 4 is formed by including the uppermost layer, the upper layer 42, and the lower layer 41, the reflected light of EUV light from the surface of the uppermost layer is reduced, whereby it is possible to smooth the vibrating structure with respect to the film thickness variations and obtain a stable phase difference and reflectance. As a material of such an uppermost layer, a silicon compound or a tantalum compound having a refractive index larger than that of the upper layer 42 of the phase shift film 4 is preferable. As the silicon compound, a material containing Si and at least one element selected from N, O, C and H, and preferably $SiO_2$, SiON, and $Si_3N_4$ can be mentioned. As the tantalum compound, a material containing Ta and at least one element selected from N, O, C, H, and B can be mentioned, and a material containing Ta and O can preferably be mentioned. The film thickness of the uppermost layer is preferably 10 nm or less, more preferably 1 to 6 nm, and still more preferably 3 to 5 nm. In a case where the upper layer 42 is a RuCr film, the uppermost layer can be, for example, a $SiO_2$ film or a $Ta_2O_5$ film.

As described above, the phase shift film 4 is formed to be a multilayer film, whereby various functions can be added to each layer.

The crystal structure of the phase shift film 4 of the reflective mask blank 100 of the present embodiment is preferably amorphous. Since the crystal structure of the phase shift film 4 is amorphous, it is possible to reduce adverse effects caused by the crystal gain of a metal or the like when the phase shift pattern 4a is formed. Thus, the crystal structure of the phase shift film 4 is made amorphous, whereby it is possible to increase the etching rate when the phase shift film 4 is etched, improve a pattern shape, and improve the processing characteristics.

In addition, in a case where focus is on improving the cross-sectional shape of the phase shift pattern 4a, it is preferable to arrange, the first layer having a higher etching rate than that of the second layer as the lower layer 41.

«Etching Mask Film»

The etching mask film can be formed on the phase shift film 4 or in contact with the surface of the phase shift film 4. As a material of the etching mask film, a material with which an etching selection ratio of the phase shift film 4 to the etching mask film is high is used. Here, the expression "an etching selection ratio of B to A" means a ratio of an etching rate of A that is a layer not desired to be etched (a layer to become a mask) to an etching rate of B that is a layer desired to be etched. Specifically, the expression "an etching selection ratio of B to A" is specified by the equation "an etching selection ratio of B to A=an etching rate of B/an etching rate of A". In addition, the expression "high selection ratio" means that a value of the selection ratio defined above is large as compared with that of an object for comparison. The etching selection ratio of the phase shift film 4 to the etching mask film is preferably 1.5 or more, and more preferably 3 or more.

In a case where the second layer (the predetermined ruthenium (Ru)-based material) is the uppermost layer of the phase shift film 4, the second layer can be etched by dry etching using a chlorine-based gas including oxygen or an oxygen gas. As a material of the etching mask film with which the etching selection ratio of the phase shift film 4 including the predetermined ruthenium (Ru)-based material with respect to the etching mask film is high, a silicon (Si)-based material or a tantalum (Ta)-based material can be used.

In a case where the uppermost layer of the phase shift film 4 is the second layer, the silicon (Si)-based material that can be used for the etching mask film is silicon or a silicon compound material. As the silicon compound, a material containing Si and at least one element selected from N, O, C, and H and a silicon-based material such as metallic silicon (metal silicide) including silicon or a silicon compound, or a metal silicon compound (a metal silicide compound) can be mentioned. As the metal silicon compound, a material including a metal, Si, and at least one element selected from N, O, C, and H can be mentioned.

As the tantalum (Ta)-based material that can be used as the etching mask film in a case where the uppermost layer of the phase shift film 4 is the second layer, a material containing tantalum (Ta) and one or more element selected from oxygen (O), nitrogen (N), carbon (C), boron (B), and hydrogen (H) can be mentioned. Among these, it is particularly preferable to use a material containing tantalum (Ta) and oxygen (O) as the material of the etching mask film. As specific examples of such a material, tantalum oxide (TaO), tantalum oxynitride (TaON), tantalum boride oxide (TaBO), and tantalum boride oxynitride (TaBON) can be mentioned.

In a case where the first layer is the uppermost layer of the phase shift film 4 and the first layer is the material containing tantalum (Ta), as a material of the etching mask film with which an etching selection ratio of the first layer to the etching mask film is high, a chromium (Cr)-based material and a silicon (Si)-based material can be mentioned. As the chromium (Cr)-based material, a material of chromium or a chromium compound can be used. As the chromium compound, a material containing Cr and at least one element selected from N, O, C, and H can be mentioned. As the silicon compound, a material similar to that described in the case where the second layer described above is the uppermost layer of the phase shift film 4 can be used.

In a case where the first layer is the uppermost layer of the phase shift film 4 and the first layer is the material containing chromium (Cr), as a material of the etching mask film with which the etching selection ratio of the first layer to the etching mask film is high, a silicon (Si)-based material and a tantalum (Ta)-based material can be mentioned. As the silicon (Si)-based material and the tantalum (Ta)-based material, materials similar to those described in the case where the second layer described above is the uppermost layer of the phase shift film 4 can be used.

The film thickness of the etching mask film is desirably 3 nm or more from the viewpoint of obtaining a function as an etching mask for accurately forming the transfer pattern on the phase shift film 4. In addition, the film thickness of the etching mask film is desirably 15 nm or less from the viewpoint of reducing the film thickness of a resist film 11.

«Back Side Conductive Film 5»

The back side conductive film 5 for an electrostatic chuck is generally formed on a side of the second main surface (the back surface) of the substrate 1 (a side opposite to a surface on which the multilayer reflective film 2 is formed). An electrical characteristic (sheet resistance) required of the back side conductive film 5 for an electrostatic chuck is usually 100Ω/☐ (Ω/square) or less. By a method of forming the back side conductive film 5, it is possible to form the back side conductive film 5 using, for example, a magnetron sputtering method or an ion beam sputtering method using a target of a metal alone such as chromium, tantalum, and the like or an alloy thereof.

A material containing chromium (Cr) for the back side conductive film 5 is preferably a Cr compound containing Cr and at least one selected from boron, nitrogen, oxygen, and carbon. As the Cr compound, for example, CrN, CrON, CrCN, CrCO, CrCON, CrBN, CrBON, CrBCN, and CrBOCN can be mentioned.

As a material containing tantalum (Ta) for the back side conductive film 5, it is preferable to use Ta (tantalum), an alloy containing Ta, or a Ta compound containing either of Ta or an alloy containing Ta and at least one from boron, nitrogen, oxygen, and carbon. As the Ta compound, TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, and TaSiCON can be mentioned.

As a material containing tantalum (Ta) or chromium (Cr), an amount of nitrogen (N) present in the surface layer thereof is preferably small. Specifically, nitrogen content in the surface layer of the back side conductive film 5 including the material containing tantalum (Ta) or chromium (Cr) is preferably less than 5 atomic %, and more preferably, the surface does not substantially contain nitrogen. This is because in the back side conductive film 5 including the material containing tantalum (Ta) or chromium (Cr), the lower the nitrogen content in the surface layer is, the higher wear resistance is.

The back side conductive film 5 is preferably including a material containing tantalum and boron. The back side conductive film 5 includes the material containing tantalum and boron, whereby the back side conductive film 5 having wear resistance and chemical resistance can be obtained. In a case where the back side conductive film 5 contains tantalum (Ta) and boron (B), B content is preferably 5 to 30 atomic %. The ratio of Ta and B (Ta:B) in a sputtering target used for forming the back side conductive film 5 is preferably from 95:5 to 70:30.

The thickness of the back side conductive film 5 is not particularly limited as long as a function as being for an electrostatic chuck is fulfilled. The thickness of the back side conductive film 5 is usually 10 nm to 200 nm. In addition, the back side conductive film 5 also has a function of adjusting stress on the side of the second main surface of the mask blank 100, and is adjusted so that a balance with stress from various films formed on the side of the first main surface is kept and the flat reflective mask blank 100 can be obtained.

<Reflective Mask 200 and Manufacturing Method of the Same>

The present embodiment is the reflective mask 200 having the phase shift pattern 4a in which the phase shift film 4 of the reflective mask blank 100 described above is partnered. The phase shift pattern 4a can be formed by patterning the phase shift film 4 of the reflective mask blank 100 described above, the phase shift film 4, by a predetermined dry etching gas (for example, a dry etching gas including a chlorine-based gas and an oxygen gas). The phase shift pattern 4a of the reflective mask 200 can absorb EUV light and reflect part of the EUV light at a predetermined phase difference (for example, 180 degrees) with respect to an opening (a part where the phase shift pattern is not formed). To pattern the phase shift film 4, an etching mask film may be provided on the phase shift film 4, if necessary, an etching mask film pattern may be used as a mask, and the phase shift film 4 may be subjected to dry etching to form the phase shift pattern 4a.

A method of manufacturing the reflective mask 200 using the reflective mask blank 100 of the present embodiment will be described. Here, an outline description will be only given, and a detailed description will be given later in Examples with reference to the drawings.

The reflective mask blank 100 is prepared, and the resist film 11 is formed on the phase shift film 4 on the first main surface of the reflective mask blank 100 (this step is not necessary in a case where the resist film 11 is provided as the reflective mask blank 100). Next, a desired pattern is drawn (exposed) on the resist film 11 and further developed and rinsed, whereby a predetermined resist pattern 11a is formed.

In the case of the reflective mask blank 100, this resist pattern 11a is used as a mask, the phase shift film 4 (the upper layer 42 and the lower layer 41) is each etched using a predetermined etching gas to form the phase shift pattern 4a, and the resist pattern 11a is removed by ashing, a resist stripping solution, or the like, whereby the phase shift pattern 4a is formed. Finally, wet cleaning is performed using an acidic and/or alkaline aqueous solution.

Here, as the etching gas for the phase shift film 4 (the upper layer 42 and the lower layer 41), it is necessary to select an appropriate etching gas as described above, depending on the material used. The materials of the phase shift film 4 (the upper layer 42 and the lower layer 41), the protective film 3, and the etching gases corresponding thereto are appropriately selected, whereby it is possible to prevent roughening of the surface of the protective film 3 when the phase shift film 4 is etched.

Through the above steps, the reflective mask 200 having a fine and highly accurate pattern having a small shadowing effect and small wall roughness can be obtained.

<Method of Manufacturing Semiconductor Device>

The present embodiment is a method of manufacturing a semiconductor device. The semiconductor device can be manufactured by setting the reflective mask 200 of the present embodiment in an exposure apparatus having an EUV light exposure light source and then by transferring a transfer pattern to a resist film formed on a transfer-receiving substrate.

Specifically, by performing EUV exposure using the reflective mask 200 described above of the present embodiment, a desired transfer pattern based on a phase shift pattern 4a on the reflective mask 200 can be formed on a semiconductor substrate while a decrease in accuracy of a transfer dimension due to a shadowing effect can be suppressed. In addition, since the phase shift pattern 4a is a fine and highly accurate pattern with small sidewall roughness, a desired pattern can be formed on the semiconductor substrate with high dimensional accuracy. With various steps such as etching of a film to be processed, formation of an insulating film and a conductive film, introduction of a dopant, and annealing in addition to this lithography step, it is possible to manufacture a semiconductor device on which a desired electronic circuit is formed.

More specifically, an EUV exposure apparatus includes a laser plasma light source that generates EUV light, an illumination optical system, a mask stage system, a reduction projection optical system, a wafer stage system, and vacuum equipment. The light source is provided with a debris trap function, a cut filter that cuts light having a long wavelength other than exposure light, a vacuum differential pumping facility, and the like. The illumination optical system and the reduction projection optical system each include a reflection mirror. The reflective mask 200 for EUV exposure is electrostatically attracted by the back side conductive film 5 formed on the second main surface of the reflective mask 200 and is mounted on a mask stage.

The light of the EUV light source is applied to the reflective mask 200 through the illumination optical system at an angle tilted by 6 to 8 degrees with respect to a vertical plane of the reflective mask 200. Reflected light from the reflective mask 200 with respect to this incident light (exposure light) is reflected (regularly reflected) in a direction opposite to an incident direction and at the same angle as an incident angle, guided to a reflective projection system usually having a reduction ratio of ¼, and exposed on a resist on a wafer (the semiconductor substrate) mounted on a wafer stage. During this time, at least a place through which EUV light passes is evacuated. In addition, when exposure is performed, mainstream exposure is scan exposure in which the mask stage and the wafer stage are synchronously scanned at a speed corresponding to the reduction ratio of the reduction projection optical system, and exposure is performed through a slit. After the exposure on the resist, this resist film subjected to the exposure is developed, whereby a resist pattern can be formed on the semiconductor substrate. In the present embodiment, the mask having the highly accurate phase shift pattern that is a thin film and has a small shadowing effect and small sidewall roughness is used. Therefore, the resist pattern formed on the semiconductor substrate is desired one with high dimensional accuracy. Etching or the like is performed using this resist pattern as a mask, whereby a predetermined wiring pattern can be formed, for example, on the semiconductor substrate. The semiconductor device is manufactured through such an exposure step, a step of processing a film to be processed, a step of forming an insulating film and a conductive film, a dopant introduction step, an annealing step, and other necessary steps.

According to the method of manufacturing a semiconductor device of the present embodiment, the reflective mask 200 capable of reducing the film thickness of the phase shift film 4, reducing the shadowing effect, and forming the fine and highly accurate phase shift pattern 4a in a stable cross-sectional shape with small sidewall roughness can be used for manufacturing a semiconductor device. Thus, a semiconductor device having a fine and highly accurate transfer pattern can be manufactured.

EXAMPLES

Hereinafter, Examples will be described with reference to the drawings. The present disclosure is not limited to these Examples. Note that in Examples, the same reference signs will be used for similar constituent elements, and the description thereof will be simplified or omitted.

Example 1

FIGS. 2A-2E are schematic cross-sectional diagrams of a main part showing a step of manufacturing a reflective mask 200 from a reflective mask blank 100.

Figure 2A:
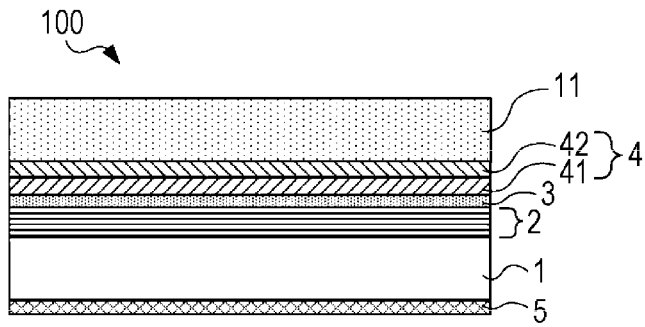
FIGS. 2A-2E are step diagrams showing, in schematic cross-sectional diagrams, a main part of a step of manufacturing a reflective mask from the reflective mask blank.

The reflective mask blank 100 has a back side conductive film 5, a substrate 1, a multilayer reflective film 2, a protective film 3, and a phase shift film 4. The phase shift film 4 of Example 1 has a lower layer 41 (a first layer) that is a TaN film and an upper layer 42 that is a RuCr film (a second layer). Then, as shown in FIG. 2A, a resist film 11 is formed on the phase shift film 4.

First, the reflective mask blank 100 of Example 1 will be described.

A $SiO_2$—$TiO_2$-based glass substrate that is a low thermal expansion glass substrate having 6025 size (approximately 152 mm×152 mm×6.35 mm) and having polished both main surfaces that are a first main surface and a second main surface was prepared as the substrate 1. The main surfaces was subjected to polishing including a rough polishing step, a precision polishing step, a local processing step, and a touch polishing step so that the main surfaces were flat and smooth.

Next, the back side conductive film 5 including a CrN film was formed on the second main surface (a back surface) of the $SiO_2$—$TiO_2$-based glass substrate (the substrate 1) by a magnetron sputtering (a reactive sputtering) method under the following conditions.

Conditions for forming the back side conductive film 5: a Cr target, a mixed gas atmosphere of Ar and $N_2$ (Ar: 90%, N: 10%), and a film thickness of 20 nm.

Next, the multilayer reflective film 2 was formed on the main surface (the first main surface) of the substrate 1 on a side opposite to a side on which the back side conductive film 5 is formed. The multilayer reflective film 2 formed on the substrate 1 was a periodic multilayer reflective film including Mo and Si in order to be the multilayer reflective film 2 suitable for EUV light having a wavelength of 13.5 nm. The multilayer reflective film 2 was formed by using a Mo target and a Si target and alternately building up a Mo layer and a Si layer on the substrate 1 in an Ar gas atmosphere by an ion beam sputtering method. First, a Si film was formed to have a film thickness of 4.2 nm, and then a Mo film was formed to have a film thickness of 2.8 nm. This stack is counted as one period, the stack of a Si film and a Mo film was built up for 40 periods in a similar manner, and finally, a Si film was formed to have a film thickness of 4.0 nm to form the multilayer reflective film 2. The number of periods was 40 periods here, but the number of periods is not limited to this number and may be, for example, 60 periods. In the case of 60 periods, the number of steps is larger than the number of steps in the case of 40 periods, but reflectance for EUV light can be increased.

Subsequently, the protective film 3 including a Ru film was formed to have a film thickness of 2.5 nm using a Ru target in an Ar gas atmosphere by an ion beam sputtering method.

Next, the first layer including the TaN film was formed as the lower layer 41 of the phase shift film 4 by the DC magnetron sputtering method. The TaN film was formed so as to have a film thickness of 15.5 nm using a Ta target in a $N_2$ gas atmosphere by the reactive sputtering. The content ratio (the atomic ratio) of the TaN film was Ta:N=88:12. When the crystal structure of the TaN film was measured by an X-ray diffractometer (XRD), the TaN film had an amorphous structure.

The refractive index n and the extinction coefficient (the refractive index imaginary part) k of the TaN film of Example 1 formed as described above at a wavelength of 13.5 nm were as follows, respectively.

The TaN film: n=0.949 and k=0.032

Next, the second layer including the RuCr film was formed as the upper layer 42 of the phase shift film 4 by the DC magnetron sputtering method. The RuCr film was formed so as to have a film thickness of 22.8 nm using a RuCr target in an Ar gas atmosphere. The content ratio (the atomic ratio) of the RuCr film was Ru:Cr=90:10. When the crystal structure of the RuCr film was measured by the X-ray diffractometer (XRD), the RuCr film had an amorphous structure.

The refractive index n and the extinction coefficient (the refractive index imaginary part) k of the RuCr film of Example 1 formed as described above at a wavelength of 13.5 nm of were as follows, respectively.

The RuCr film: n=0.890 and k=0.019

The relative reflectance of the phase shift film 4 including the TaN film and the RuCr film described above at a wavelength of 13.5 nm was 20.1%. In addition, the total film thickness of the phase shift film 4 is 38.3 nm. At this film thickness, a phase difference when the phase shift film 4 was patterned corresponds to 180 degrees. The film thickness was reduced by approximately 41% from 65 nm that is the film thickness of a phase shift film 4 that is a TaN film in Comparative Example 1 to be described later.

Next, the reflective mask 200 was manufactured using the reflective mask blank 100 described above.

Figure 2B:
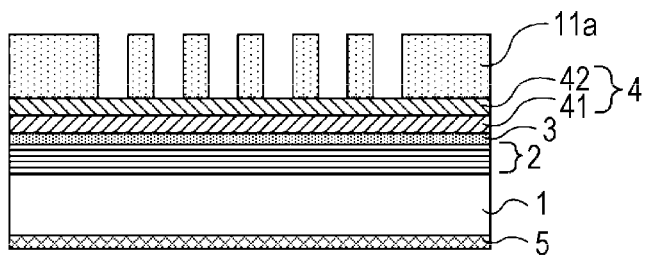

The resist film 11 was formed with a thickness of 100 nm (FIG. 2A) on the phase shift film 4 of the reflective mask blank 100. Then, a desired pattern was drawn (exposed) on this resist film 11 and further developed and rinsed, whereby a predetermined resist pattern 11a was formed (FIG. 2B).

Figure 2C:
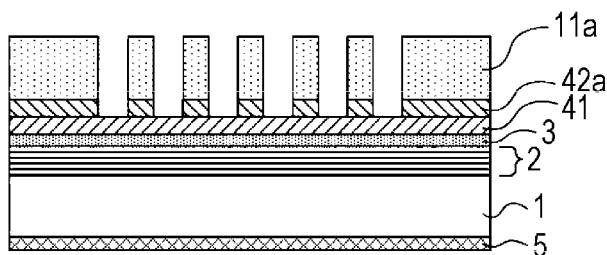

Next, using the resist pattern 11a as a mask, the RuCr film (the upper layer 42) was subjected to dry etching using a mixed gas of a $Cl_2$ gas and an $O_2$ gas (gas flow rate ratio $Cl_2:O_2$=4:1). As a result, an upper layer pattern 42a was formed (FIG. 2C).

Figure 2D:
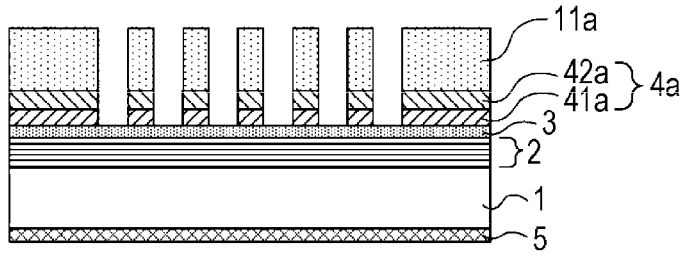

Next, using the resist pattern 11a and the upper layer pattern 42a as a mask, the TaN film (the lower layer 41) was subjected to dry etching using a halogen-based gas. As a result, the lower layer pattern 41a was formed (FIG. 2D). Specifically, an oxide film that is a surface layer of the TaN film was subjected to dry etching using a $CF_4$ gas, and then the TaN film was subjected to dry etching using a $Cl_2$ gas.

Figure 2E:
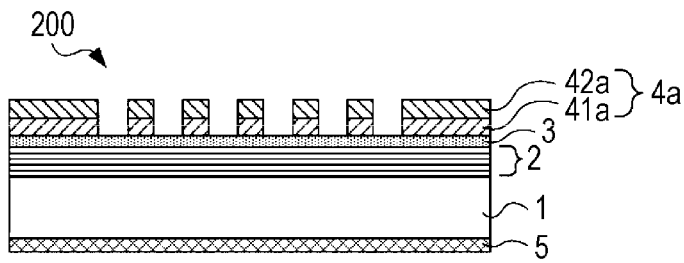

Thereafter, the resist pattern 11a was removed by ashing, a resist stripping solution, or the like. Finally, wet cleaning was performed with deionized water (DIW) to manufacture the reflective mask 200 of Example 2 (FIG. 2E). Note that a mask defect inspection is performed, if necessary after the wet cleaning, and a mask defect can be corrected appropriately.

In the reflective mask 200 of Example 1, since the phase shift film 4 is the TaN film and the RuCr film, workability in dry etching using a predetermined etching gas is good, and a phase shift pattern 4a was formed highly accurately. In addition, the total film thickness of the phase shift pattern 4a is 38.3 nm, and was made thinner than that of an absorber film formed of a conventional Ta-based material, and the shadowing effect was reduced as compared with Comparative Example 1.

In addition, since in the reflective mask 200 created in Example 1, the sidewall roughness of the phase shift pattern 4a is small and the cross-sectional shape thereof is stable, the reflective mask 200 had high transfer accuracy with little variations in line edge roughness (LER) and in-plane dimensions of a transferred and formed resist pattern. In addition, as described above, since the relative reflectance of a phase shift surface (a reflectance with respect to the reflectance of a surface of the multilayer reflective film 2 with the protective film 3) is 20.1%, a sufficient phase shift effect was obtained, and EUV exposure with a high exposure margin and a high focus margin was performed.

The reflective mask 200 manufactured in Example 1 was set in an EUV exposure scanner, and EUV exposure was performed on a wafer on which a film to be processed and a resist film were formed on a semiconductor substrate. Then, this resist film subjected to the exposure was developed, whereby a resist pattern was formed on the semiconductor substrate on which the film to be processed was formed. In addition, this resist pattern was transferred on the film to be processed by etching, and a semiconductor device having desired characteristics was manufactured by being subjected to various steps such as formation of an insulating film and a conductive film, introduction of a dopant, and annealing, Example 2

Example 2 is an example in a case where a lower layer 41 that is a CrOC film (a first layer) and an upper layer 42 that is a RuNi film (a second layer) were used as a phase shift film 4 and film thickness was adjusted so that a phase difference of 180 degrees was obtained. Example 2 is the same as Example 1 except for the above.

That is, in Example 2, as in Example 1, a back side conductive film 5 including a CrN film was formed on a second main surface (a back surface) of a $SiO_2$—$TiO_2$ glass substrate 1, a multilayer reflective film 2 was formed on a main surface (a first main surface) of the substrate 1 on an opposite side, and a protective film 3 including a Ru film was formed on a surface of a multilayer reflective film 2.

Next, the first layer including the CrOC film was formed as the lower layer 41 of the phase shift film 4 by a DC magnetron sputtering method. The CrOC film was formed so as to have a film thickness of 13.8 nm using a Cr target by reactive sputtering using a mixed gas of an Ar gas, a $CO_2$ gas, and a He gas. The content ratio (the atomic ratio) of the CrOC film was Cr:O:C=70:15:15. When the crystal structure of the CrOC film was measured by an X-ray diffractometer (XRD), the CrOC film had an amorphous structure.

The refractive index n and the extinction coefficient (the refractive index imaginary part) k of the CrOC film of Example 2 formed as described above at a wavelength of 13.5 nm were as follows, respectively.

The CrOC film: n=0.941 and k=0.031

Next, the second layer including the RuNi film was formed as the upper layer 42 of the phase shift film 4 by the DC magnetron sputtering method. The RuNi film was formed so as to have a film thickness of 23.5 nm using a RuNi target in an Ar gas atmosphere. The content ratio (the atomic ratio) of the RuNi film was Ru:Ni=90:10. When the crystal structure of the RuNi film was measured by the X-ray diffractometer (XRD), the RuNi film had an amorphous structure.

The refractive index n and the extinction coefficient (the refractive index imaginary part) k of the RuNi film of Example 2 formed as described above at a wavelength of 13.5 nm were as follows, respectively.

The RuNi film: n=0.891 and k=0.022

The relative reflectance of the phase shift film 4 including the CrOC film and the RuNi film at a wavelength of 13.5 nm was 20.2%. In addition, the total film thickness of the phase shift film 4 is 37.3 nm. At this film thickness, a phase difference when the phase shift film 4 was patterned corresponds to 180 degrees. The film thickness was reduced by approximately 43% from 65 nm that is the thickness of the phase shift film 4 that is a TaN film in Comparative Example 1 to be described later.

Next, as in Example 1, a reflective mask 200 of Example 2 was manufactured using the reflective mask blank 100 described above.

As in Example 1, a resist film 11 was formed with a thickness of 100 nm on the phase shift film 4 of the reflective mask blank 100 (FIG. 2A). Then, a desired pattern was drawn (exposed) on this resist film 11 and further developed and rinsed, whereby a predetermined resist pattern 11a was formed (FIG. 2B).

Next, using the resist pattern 11a as a mask, the RuNi film (the upper layer 42) was subjected to dry etching using an $O_2$ gas. As a result, an upper layer pattern 42a was formed (FIG. 2C).

Next, using the resist pattern 11a and the upper layer pattern 42a as a mask, the CrOC film (the lower layer 41) was subjected to dry etching using a $Cl_2$ gas. As a result, a lower layer pattern 41a was formed (FIG. 2D).

Thereafter, as in Example 1, the resist pattern 11a was removed and cleaned to manufacture the reflective mask 200 of Example 2 (FIG. 2E).

In the reflective mask 200 of Example 2, since the phase shift film 4 is the CrOC film and the RuNi film, workability in dry etching using a predetermined etching gas is good, and a phase shift pattern 4a was formed highly accurately. In addition, the total film thickness of the phase shift pattern 4a is 37.3 nm and was made thinner than that of the absorber film formed of the conventional Ta-based material, and the shadowing effect was reduced as compared with Comparative Example 1.

In addition, since in the reflective mask 200 created in Example 2, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 20.2%, a sufficient phase shift effect was obtained, and EUV exposure with a high exposure margin and a high focus margin was performed.

As in the case of Example 1, using the reflective mask 200 manufactured in Example 2, a semiconductor device having desired characteristics was manufactured.

Example 3

Example 3 is an example in a case where a $SiO_2$ film was used as a protective film 3, a lower layer 41 that is a RuCo film (a second layer) and an upper layer 42 that is a TaN film (a first layer) were used as a phase shift film 4, and film thickness was adjusted so that a phase difference of 180 degrees was obtained. Example 3 is the same as Example 1 except for the above.

That is, in Example 3, as in Example 1, a back side conductive film 5 including a CrN film was formed on a second main surface (a back surface) of a $SiO_2$—$TiO_2$ glass substrate 1, a multilayer reflective film 2 was formed on a main surface (a first main surface) of the substrate 1 on an opposite side.

Subsequently, the protective film 3 including the $SiO_2$ film was formed to have a film thickness of 2.5 nm on a surface of the multilayer reflective film 2 in an Ar gas atmosphere by an RF sputtering method using a $SiO_2$ target.

Next, the second layer including the RuCo film was formed as the lower layer 41 of the phase shift film 4 by a DC magnetron sputtering method. The RuCo film was formed so as to have a film thickness of 23.2 nm using a RuCo target in an Ar gas atmosphere. The content ratio (the atomic ratio) of the RuCo film was Ru:Co=90:10. When the crystal structure of the RuCo film was measured by an X-ray diffractometer (XRD), the RuCo film had an amorphous structure.

The refractive index n and the extinction coefficient (the refractive index imaginary part) k of the RuCo film of Example 3 formed as described above at a wavelength of 13.5 nm were as follows, respectively.

The RuCo film: n=0.890 and k=0.021

Next, the first layer including the TaN film was formed as the upper layer 42 of the phase shift film 4 by the DC magnetron sputtering method. The TaN film was formed so as to have a film thickness of 13.9 nm using a Ta target in a $N_2$ gas atmosphere by reactive sputtering. The content ratio (the atomic ratio) of the TaN film was Ta:N=88:12. When the crystal structure of the TaN film was measured by an X-ray diffractometer (XRD), the TaN film had an amorphous structure.

The refractive index n and the extinction coefficient (the refractive index imaginary part) k of the TaN film of Example 3 formed as described above at a wavelength of 13.5 nm were as follows, respectively.

The TaN film: n=0.949 and k=0.032

The relative reflectance of the phase shift film 4 including the RuCo film and the TaN film described above at a wavelength of 13.5 nm was 19.9%. In addition, the total film thickness of the phase shift film 4 is 37.1 nm. At this film thickness, a phase difference when the phase shift film 4 was patterned corresponds to 180 degrees. The film thickness was reduced by approximately 43% from 65 nm that is the thickness of the phase shift film 4 that is a TaN film in Comparative Example 1 to be described later.

Next, as in Example 1, a reflective mask 200 of Example 3 was manufactured using the reflective mask blank 100 described above.

As in Example 1, a resist film 11 was formed with a thickness of 100 nm on the phase shift film 4 of the reflective mask blank 100 (FIG. 2A). Then, a desired pattern was drawn (exposed) on this resist film 11 and further developed and rinsed, whereby a predetermined resist pattern 11a was formed (FIG. 2B).

Next, the resist pattern 11a was used as a mask and the TaN film (the upper layer 42) was subjected to dry etching using etching by a halogen-based gas. As a result, an upper layer pattern 42a was formed (FIG. 2C). Specifically, an oxide film that is a surface layer of the TaN film was subjected to dry etching using a $CF_4$ gas, and then the TaN film was subjected to dry etching using a $Cl_2$ gas.

Next, using the resist pattern 11a and the upper layer pattern 42a as a mask, the RuCo film (the lower layer 41) was subjected to dry etching using a mixed gas of a $Cl_2$ gas and an $O_2$ gas (gas flow rate ratio $Cl_2:O_2=4:1$). As a result, a lower layer pattern 41a was formed (FIG. 2D).

Thereafter, as in Example 1, the resist pattern 11a was removed and cleaned to manufacture the reflective mask 200 of Example 3 (FIG. 2E).

In the reflective mask 200 of Example 3, since the phase shift film 4 is the TaN film and the RuCo film, workability in dry etching using a predetermined etching gas is good, and a phase shift pattern 4a was formed highly accurately. In addition, the total film thickness of the phase shift pattern 4a is 37.1 nm and was made thinner than that of the absorber film formed of the conventional Ta-based material, and the shadowing effect was reduced as compared with Comparative Example 1.

In addition, since in the reflective mask 200 created in Example 3, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 19.9%, a sufficient phase shift effect was obtained, and EUV exposure with a high exposure margin and a high focus margin was performed.

As in the case of Example 1, using the reflective mask 200 manufactured in Example 3, a semiconductor device having desired characteristics was manufactured.

Example 4

Example 4 is an example in a case where a lower layer 41 that is a RuCr film (a second layer) and an upper layer 42 that is a CrOC film (a first layer) as a phase shift film 4, and film thickness was adjusted so that a phase difference of 180 degrees was obtained. Example 4 is the same as Example 3 except for the above.

That is, in Example 4, as in Example 3, a back side conductive film 5 including a CrN film was formed on a second main surface (a back surface) of a $SiO_2$—$TiO_2$ glass substrate 1, and a multilayer reflective film 2 and a protective film 3 of a $SiO_2$ film were formed on a main surface (a first main surface) of the substrate 1 on an opposite side.

Next, the second layer including the RuCr film was formed as the lower layer 41 of the phase shift film 4 by a DC magnetron sputtering method. The RuCr film was formed so as to have a film thickness of 22.2 nm using a RuCr target in an Ar gas atmosphere. The content ratio (the atomic ratio) of the RuCr film was Ru:Cr=90:10. When the crystal structure of the RuCr film was measured by the X-ray diffractometer (XRD), the RuCr film had an amorphous structure.

The refractive index n and the extinction coefficient (the refractive index imaginary part) k of the RuCr film of Example 4 formed as described above at a wavelength of 13.5 nm were as follows, respectively.

The RuCr film: n=0.890 and k=0.019

Next, the first layer including the CrOC film was formed as the upper layer 42 of the phase shift film 4 by the DC magnetron sputtering method. The CrOC film was formed so as to have a film thickness of 15.4 nm using a Cr target by reactive sputtering using a mixed gas of an Ar gas, a $CO_2$ gas, and a He gas. The content ratio (the atomic ratio) of the CrOC film was Cr:O:C=70:15:15. When the crystal structure of the CrOC film was measured by an X-ray diffractometer (XRD), the CrOC film had an amorphous structure.

The refractive index n and the extinction coefficient (the refractive index imaginary part) k of the CrOC film of Example 4 formed as described above at a wavelength of 13.5 nm were as follows, respectively.

The CrOC film: n=0.941 and k=0.031

The relative reflectance of the phase shift film 4 including the above RuCr film and CrOC film described above at a wavelength of 13.5 nm was 20.2%. In addition, the total film thickness of the phase shift film 4 is 37.6 nm. At this film thickness, a phase difference when the phase shift film 4 was patterned corresponds to 180 degrees. The film thickness was reduced by approximately 42% from 65 nm that is the thickness of a phase shift film 4 that is a TaN film in Comparative Example 1 to be described later.

Next, as in Example 1, a reflective mask 200 of Example 4 was manufactured using the reflective mask blank 100 described above.

As in Example 1, a resist film 11 was formed with a thickness of 100 nm on the phase shift film 4 of the reflective mask blank 100 (FIG. 2A). Then, a desired pattern was drawn (exposed) on this resist film 11 and further developed and rinsed, whereby a predetermined resist pattern 11a was formed (FIG. 2B).

Next, using the resist pattern 11a as a mask, the CrOC film (the upper layer 42) was subjected to dry etching using a mixed gas of a $Cl_2$ gas and an $O_2$ gas (gas flow rate ratio $Cl_2:O_2=4:1$). As a result, an upper layer pattern 42a was formed (FIG. 2C).

Subsequently, the RuCr film (the lower layer 41) was subjected to dry etching using the same mixed gas as that for the CrOC film (the upper layer 42) (a mixed gas of a $Cl_2$ gas and an $O_2$ gas (gas flow rate ratio $Cl_2:O_2=4:1$)). As a result, a lower layer pattern 41a was formed (FIG. 2D). The upper layer 42 and the lower layer 41 were consecutively subjected to dry etching.

Thereafter, as in Example 1, the resist pattern 11a was removed and cleaned to manufacture the reflective mask 200 of Example 4 (FIG. 2E).

In the reflective mask 200 of Example 4, since the phase shift film 4 is the CrOC film and the RuCr film, workability in dry etching using a predetermined etching gas is good, and a phase shift pattern 4a was formed highly accurately. In addition, since both the CrOC film and the RuCr film were consecutively etched using the same etching gas, productivity is high. In addition, the total film thickness of the phase shift pattern 4a is 37.6 nm and was made thinner than that of the absorber film formed of the conventional Ta-based material, and the shadowing effect was reduced as compared with Comparative Example 1.

In addition, since in the reflective mask 200 created in Example 4, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 20.2%, a sufficient phase shift effect was obtained, and EUV exposure with a high exposure margin and a high focus margin was performed.

As in the case of Example 1, using the reflective mask 200 manufactured in Example 4, a semiconductor device having desired characteristics was manufactured.

Example 5

Example 5 is an example in a case where a RuNb film was used as a protective film 3, a lower layer 41 that is a TaN film (a first layer) and an upper layer 42 that is a RuNb film (a second layer) were used as a phase shift film 4, and film thickness was adjusted so that a phase difference of 180 degrees was obtained. Example 5 is the same as Example 1 except for the above.

That is, in Example 5, the protective film 3 including the RuNb film was formed on a surface of a multilayer reflective film 2 similar to that in Example 1. The RuNb film was formed so as to have a film thickness of 2.5 nm using a RuNb target in an Ar gas atmosphere. The content ratio (the atomic ratio) of the RuNb film was Ru:Nb=80:20.

Next, the first layer including the TaN film was formed on the RuNb film, as the lower layer 41 of the phase shift film 4. The TaN film was formed to have a film thickness of 16.5 nm by a film forming method similar to that in Example 1. The refractive index n and the extinction coefficient k at a wavelength of 13.5 nm of the TaN film were the same as those in Example 1.

Thereafter, the second layer including the RuNb film was formed as the upper layer 42 of the phase shift film 4 by a DC magnetron sputtering method. The RuNb film was formed so as to have a film thickness of 22.9 nm using a RuNb target in an Ar gas atmosphere. The content ratio (the atomic ratio) of the RuNb film was Ru:Nb=80:20. When the crystal structure of the RuNb film was measured by an X-ray diffractometer (XRD), the RuNb film had an amorphous structure.

The refractive index n and the extinction coefficient k of the RuNb film of Example 5 formed as described above at a wavelength of 13.5 nm were as follows, respectively.

The RuNb film: n=0.897 and k=0.014

The relative reflectance of the phase shift film 4 described above at a wavelength of 13.5 nm was 19.6% (the absolute reflectance was 13.1%). In addition, the total film thickness of the phase shift film 4 is 39.4 nm. At this film thickness, a phase difference when the phase shift film 4 was patterned corresponds to 180 degrees. The film thickness was reduced by approximately 39% from 65 nm that is the thickness of the phase shift film 4 that is a TaN film in Comparative Example 1 to be described later.

Next, as in Example 1, a reflective mask 200 of Example 5 was manufactured using the reflective mask blank 100 described above. The RuNb film was subjected to dry etching using a mixed gas of a $Cl_2$ gas and an $O_2$ gas (gas flow rate ratio $Cl_2:O_2$=4:1). An oxide film that is a surface layer of the TaN film was subjected to dry etching using a $CF_4$ gas, and then the TaN film was subjected to dry etching using a $Cl_2$ gas.

In the reflective mask 200 of Example 5, since the phase shift film 4 is the TaN film and the RuNb film, workability in dry etching using a predetermined etching gas is good, and a phase shift pattern 4a was formed highly accurately. In addition, the total film thickness of the phase shift pattern 4a is 39.4 nm, and was made thinner than that of the absorber film formed of the conventional Ta-based material, and the shadowing effect was reduced as compared with Comparative Example 1.

In addition, since in the reflective mask 200 created in Example 5, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 19.6% (the absolute reflectance was 13.1%), a sufficient phase shift effect was obtained, and EUV exposure with a high exposure margin and a high focus margin was performed.

As in the case of Example 1, using the reflective mask 200 manufactured in Example 5, a semiconductor device having desired characteristics was manufactured.

Example 6

Example 6 is an example in a case where a RuNb film was used as a protective film 3, a lower layer 41 that is a CrOC film (a first layer) and an upper layer 42 that is a RuV film (a second layer) were used as a phase shift film 4, and film thickness was adjusted so that a phase difference of 180 degrees was obtained. Example 6 is the same as Example 1 except for the above.

That is, in Example 6, the protective film 3 including a RuNb film similar to that in Example 5 was formed on the surface of a multilayer reflective film 2 similar to that in Example 1.

Next, a first layer including the CrOC film was formed on the RuNb film, as the lower layer 41 of the phase shift film 4. The CrOC film was formed so as to have a film thickness of 14.7 nm by a film forming method similar to that in Example 2. The refractive index n and the extinction coefficient k at a wavelength of 13.5 nm of the CrOC film were the same as those in Example 2.

Thereafter, the second layer including the RuV film was formed as the upper layer 42 of the phase shift film 4 by a DC magnetron sputtering method. The RuV film was formed so as to have a film thickness of 24 nm using a RuV target in an Ar gas atmosphere. The content ratio (the atomic ratio) of the RuV film was Ru:V=70:30. When the crystal structure of the RuV film was measured by the X-ray diffractometer (XRD), the RuV film had an amorphous structure.

The refractive index n and the extinction coefficient (the refractive index imaginary part) k of the RuV film of Example 6 formed as described above at a wavelength of 13.5 nm were as follows, respectively.

The RuV film: n=0.903 and k=0.020

The relative reflectance of the phase shift film 4 described above at a wavelength of 13.5 nm was 20.1% (the absolute reflectance was 13.4%). In addition, the total film thickness of the phase shift film 4 is 38.7 nm. At this film thickness, a phase difference when the phase shift film 4 was patterned corresponds to 180 degrees. The film thickness was reduced by approximately 40% from 65 nm that is the thickness of the phase shift film 4 that is a TaN film in Comparative Example 1 to be described later.

Next, as in Example 1, a reflective mask 200 of Example 6 was manufactured using the reflective mask blank 100 described above. The RuV film was subjected to dry etching using a mixed gas of a $Cl_2$ gas and an $O_2$ gas (gas flow rate ratio $Cl_2:O_2=4:1$). The CrOC film was subjected to dry etching using a $Cl_2$ gas.

In the reflective mask 200 of Example 6, since the phase shift film 4 is the CrOC film and the RuV film, workability in dry etching using a predetermined etching gas is good, and a phase shift pattern 4a was formed highly accurately. In addition, the total film thickness of the phase shift pattern 4a is 38.7 nm and was made thinner than that of the absorber film formed of the conventional Ta-based material, and the shadowing effect was reduced as compared with Comparative Example 1.

In addition, since in the reflective mask 200 created in Example 6, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 20.1% (the absolute reflectance was 13.4%), a sufficient phase shift effect was obtained, and EUV exposure with a high exposure margin and a high focus margin was performed.

As in the case of Example 1, using the reflective mask 200 manufactured in Example 6, a semiconductor device having desired characteristics was manufactured.

Example 7

Example 7 is an example in a case where an $SiO_2$ film was used as a protective film 3, a lower layer 41 that is a RuV film (a second layer) and an upper layer 42 that is a TaN film (a first layer) were used as a phase shift film 4, and film thickness was adjusted so that a phase difference of 180 degrees was obtained. Example 7 is the same as Example 1 except for the above.

That is, in Example 7, the protective film 3 including the $SiO_2$ film similar to that in Example 3 was formed on a surface of a multilayer reflective film 2 similar to that in Example 1.

Next, the second layer including the RuV film was formed on the $SiO_2$ film, as the lower layer 41 of the phase shift film 4. The RuV film was formed so as to have a film thickness of 29 nm by a film forming method similar to that in Example 6. The refractive index n and the extinction coefficient k at a wavelength of 13.5 nm of the RuV film were the same as those in Example 6.

Thereafter, the second layer including the TaN film was formed as the upper layer 42 of the phase shift film 4. The TaN film was formed so as to have a film thickness of 9.2 nm by a film forming method similar to that in Example 1. The refractive index n and the extinction coefficient k at a wavelength of 13.5 nm of the TaN film were the same as those in Example 1.

The relative reflectance of the phase shift film 4 described above at a wavelength of 13.5 nm was 19.9% (the absolute reflectance was 13.3%). In addition, the total film thickness of the phase shift film 4 is 33.2 nm. At this film thickness, a phase difference when the phase shift film 4 was patterned corresponds to 180 degrees. The film thickness was reduced by approximately 49% from 65 nm that is the thickness of the phase shift film 4 that is a TaN film in Comparative Example 1 to be described later.

Next, as in Example 1, a reflective mask 200 of Example 7 was manufactured using the reflective mask blank 100 described above. An oxide film that is a surface layer of the TaN film was subjected to dry etching using a $CF_4$ gas, and then the TaN film was subjected to dry etching using a $Cl_2$ gas. The RuV film was subjected to dry etching using a mixed gas of a $Cl_2$ gas and an $O_2$ gas (gas flow rate ratio $Cl_2:O_2=4:1$).

In the reflective mask 200 of Example 7, since the phase shift film 4 is the RuV film and the TaN film, workability in dry etching using a predetermined etching gas is good, and a phase shift pattern 4a was formed highly accurately. In addition, the total film thickness of the phase shift pattern 4a is 39.4 nm, and was made thinner than that of the absorber film formed of the conventional Ta-based material, and the shadowing effect was reduced as compared with Comparative Example 1.

In addition, since in the reflective mask 200 created in Example 7, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 19.9% (the absolute reflectance was 13.3%), a sufficient phase shift effect was obtained, and EUV exposure with a high exposure margin and a high focus margin was performed.

As in the case of Example 1, using the reflective mask 200 manufactured in Example 7, a semiconductor device having desired characteristics was manufactured.

Example 8

Example 8 is an example in a case where an $SiO_2$ film was used as a protective film 3, a lower layer 41 that is a RuNb film (a second layer) and an upper layer 42 that is a CrOC film (a first layer) were used as a phase shift film 4, and film thickness was adjusted so that a phase difference of 180 degrees was obtained. Example 8 is the same as Example 1 except for the above.

That is, in Example 8, the protective film 3 including the $SiO_2$ film similar to that in Example 3 was formed on a surface of a multilayer reflective film 2 similar to that in Example 1.

Next, the second layer including the RuNb film was formed on the $SiO_2$ film, as the lower layer 41 of the phase shift film 4. The RuNb film was formed so as to have a film thickness of 18.3 nm by a film forming method similar to that in Example 5. The refractive index n and the extinction coefficient k at a wavelength of 13.5 nm of the RuNb film were the same as those in Example 5.

Thereafter, the second layer including the CrOC film was formed as the upper layer 42 of the phase shift film 4. The CrOC film was formed so as to have a film thickness of 20.7 nm by a film forming method similar to that in Example 1. The refractive index n and the extinction coefficient k at a wavelength of 13.5 nm of the CrOC film were the same as those in Example 2.

The relative reflectance of the phase shift film 4 described above at a wavelength of 13.5 nm was 19.7% (the absolute reflectance was 13.1%). In addition, the total film thickness of the phase shift film 4 is 39 nm. At this film thickness, a phase difference when the phase shift film 4 was patterned corresponds to 180 degrees. The film thickness was reduced by about 40% from 65 nm that is the thickness of the phase shift film 4 that is a TaN film in Comparative Example 1 to be described later.

Next, as in Example 1, a reflective mask 200 of Example 8 was manufactured using the reflective mask blank 100 described above. The CrOC film and the RuNb film were subjected to dry etching using a mixed gas of a Cl₂ gas and an O₂ gas (gas flow rate ratio Cl₂:O₂=4:1).

In the reflective mask 200 of Example 8, since the phase shift film 4 is the RuNb film and a CrOC film, workability in dry etching using a predetermined etching gas is good, and a phase shift pattern 4a was formed highly accurately. In addition, the total film thickness of the phase shift pattern 4a is 39 nm and was made thinner than that of the absorber film formed of the conventional Ta-based material, and the shadowing effect was reduced as compared with Comparative Example 1.

In addition, since in the reflective mask 200 created in Example 8, the sidewall roughness of the phase shift pattern 4a is small and the cross-sectional shape thereof is stable, the reflective mask 200 had high transfer accuracy with little variations in LER and in-plane dimensions of a transferred and formed resist pattern. In addition, as described above, since the relative reflectance of the phase shift surface is 19.7% (the absolute reflectance was 13.1%), a sufficient phase shift effect was obtained, and EUV exposure with a high exposure margin and a high focus margin was performed.

As in the case of Example 1, using the reflective mask 200 manufactured in Example 8, a semiconductor device having desired characteristics was manufactured.

Comparative Example 1

In Comparative Example 1, a reflective mask blank 100 and a reflective mask 200 were each manufactured to have a structure similar to that in Example 1 by a method similar to that in Example 1, and a semiconductor device was manufactured by a method similar to that in Example 1, except that in Comparative Example 1, a single-layer TaN film was used as a phase shift film 4.

The single-layer TaN film (the phase shift film 4) was formed on a protective film 3 having a mask blank structure of Example 1. By a method of forming this TaN film, a TaN film was formed using Ta as a target by reactive sputtering in a mixed gas atmosphere of a Xe gas and a N₂ gas. The film thickness of the TaN film is 65 nm, and the element ratio of this film is 88 atomic % for Ta and 12 atomic % for N.

The refractive index n and the extinction coefficient (the refractive index imaginary part) k of the TaN film formed as described above at a wavelength of 13.5 nm were as follows, respectively.

The TaN film: n=0.949 and k=0.032

The phase difference of the phase shift film 4 including the single-layer TaN film described above at a wavelength of 13.5 nm is 180 degrees. The reflectance was 1.7% with respect to the multilayer reflective film 2 surface.

Thereafter, a resist film 11 was formed on the phase shift film 4 including the single-layer TaN film by a method similar to that in Example 1, and a desired pattern was drawn (exposed) and developed and rinsed, whereby a resist pattern 11a was formed. Then, using the resist pattern 11a as a mask, the phase shift film 4 including the single-layer TaN film was subjected to dry etching using a chlorine gas to form a phase shift pattern 4a. Removal of the resist pattern 11a, cleaning of the mask, and the like were performed in the same manner as that in Example 1 to manufacture the reflective mask 200.

The film thickness of the phase shift pattern 4a was 65 nm, and the shadowing effect could not be reduced. In addition, as described above, since the relative reflectance of the phase shift surface (reflectance with respect to the reflectance of the multilayer reflective film surface with a protective film) was 1.7%, a sufficient phase shift effect could not be obtained, and EUV exposure with a high exposure margin and a high focus margin could not be performed.

As described above, the total film thickness of the phase shift film 4 of each of Examples 1 to 8 was reduced by approximately 40% or more from 65 nm that is the film thickness of the phase shift film 4 of Comparative Example 1. Thus, it was revealed that the shadowing effect can be reduced with the reflective masks 200 of Examples 1 to 8.

REFERENCE SIGNS LIST

1 Substrate
2 Multilayer reflective film
3 Protective film
4 Phase shift film
4a Phase shift pattern
41 Lower layer
41a Lower layer pattern
42 Upper layer
42a Upper layer pattern
5 Back side conductive film
11 Resist film
11a Resist pattern
100 Reflective mask blank
200 Reflective mask

The invention claimed is:

1. A reflective mask blank comprising:
a substrate;
a multilayer reflective film on the substrate; and
a phase shift film on the multilayer reflective film,
wherein the phase shift film comprises a first layer and a second layer, the first layer comprises at least one selected from tantalum (Ta) and chromium (Cr), and the second layer comprises ruthenium (Ru) and at least one selected from chromium (Cr), nickel (Ni), cobalt (Co), vanadium (V), niobium (Nb), molybdenum (Mo), tungsten (W), and rhenium (Re), and
a refractive index n of the second layer for EUV light is 0.860 to 0.950 and an extinction coefficient k of the second layer for EUV light is 0.008 to 0.095.

2. The reflective mask blank according to claim 1, wherein a refractive index n of the second layer is 0.860 to 0.940 and an extinction coefficient k of the second layer is 0.008 to 0.057.

3. The reflective mask blank according to claim 2, wherein a relative reflectance of the phase shift film is 10% to 40%.

4. The reflective mask blank according to claim 2, wherein a phase difference of the phase shift film is 200 degrees to 230 degrees.

5. The reflective mask blank according to claim 1, wherein a thickness of the first layer is 30 nm or less.

6. The reflective mask blank according to claim 1, wherein a thickness of the second layer is 50 nm or less.

7. The reflective mask blank according to claim 1, wherein a thickness of the phase shift film is 50 nm or less.

8. The reflective mask blank according to claim 1, wherein the first layer is formed between the multilayer reflective film and the second layer.

9. The reflective mask blank according to claim 1, further comprising a protective film between the multilayer reflective film and the phase shift film, wherein the protective film comprises ruthenium (Ru).

10. A reflective mask comprising:
a substrate;
a multilayer reflective film on the substrate; and
a phase shift film with a pattern on the multilayer reflective film, wherein
the phase shift film comprises a first layer and a second layer, the first layer comprises at least one selected from tantalum (Ta) and chromium (Cr), and the second layer comprises ruthenium (Ru) and at least one selected from chromium (Cr), nickel (Ni), cobalt (Co), vanadium (V), niobium (Nb), molybdenum (Mo), tungsten (W), and rhenium (Re), and
a refractive index n of the second layer for EUV light is 0.860 to 0.950 and an extinction coefficient k of the second layer for EUV light is 0.008 to 0.095.

11. A method of manufacturing a semiconductor device, the method comprising the reflective mask according to claim 10 in an exposure apparatus comprising an exposure light source that emits EUV light, and transferring a transfer pattern to a resist film formed on a transferred substrate.

12. The reflective mask according to claim 10, wherein a refractive index n of the second layer is 0.860 to 0.940 and an extinction coefficient k of the second layer is 0.008 to 0.057.

13. The reflective mask according to claim 12, wherein a relative reflectance of the phase shift film is 10% to 40%.

14. The reflective mask according to claim 12, wherein a phase difference of the phase shift film is 200 degrees to 230 degrees.

15. The reflective mask according to claim 10, wherein a thickness of the first layer is 30 nm or less.

16. The reflective mask according to claim 10, wherein a thickness of the second layer is 50 nm or less.

17. The reflective mask according to claim 10, wherein a thickness of the phase shift film is 50 nm or less.

18. The reflective mask according to claim 10, wherein the first layer is formed between the multilayer reflective film and the second layer.

19. The reflective mask according to claim 10, further comprising a protective film between the multilayer reflective film and the phase shift film, wherein the protective film comprises ruthenium (Ru).

* * * * *